US012687665B2

(12) United States Patent     (10) Patent No.:   US 12,687,665 B2

Zaczek et al.     (45) Date of Patent:    Jul. 21, 2026

(54) METHOD FOR PRODUCING A MIRROR OF A MICROLITHOGRAPHIC PROJECTION EXPOSURE APPARATUS

(71) Applicant: Carl Zeiss SMT GmbH, Oberkochen (DE)

(72) Inventors: Christoph Zaczek, Heubach (DE); Erik Loopstra, Huernheim (DE); Eric Eva, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 89 days.

(21) Appl. No.: 18/475,450

(22) Filed: Sep. 27, 2023

(65) Prior Publication Data

US 2024/0019613 A1     Jan. 18, 2024

Related U.S. Application Data

(63) Continuation of application No. PCT/EP2022/056931, filed on Mar. 17, 2022.

(30) Foreign Application Priority Data

Apr. 8, 2021    (DE) .......................... 102021203475.6

(51) Int. Cl.
   *G02B 5/08*       (2006.01)
   *G03F 7/00*       (2006.01)

(52) U.S. Cl.
   CPC ....... G02B 5/0891 (2013.01); G03F 7/70316 (2013.01); G03F 7/70891 (2013.01)

(58) Field of Classification Search
   CPC ............... G02B 5/0891; G03F 7/70316; G03F 7/70891
   See application file for complete search history.

(56) References Cited

U.S. PATENT DOCUMENTS 4,409,278 A   *   10/1983   Jochym ............... C04B 35/6303
                                     228/198
4,752,180 A   *   6/1988   Yoshikawa ......... H01L 21/6838
                                     414/737

(Continued)

FOREIGN PATENT DOCUMENTS

DE     10 2008 009 600 A1    8/2009
DE     10 2017 220 586 A1    5/2019

(Continued)

OTHER PUBLICATIONS

International Search Report and Written Opinion for corresponding PCT Appl No. PCT/EP2022/056931, dated Jul. 5, 2022.

(Continued)

*Primary Examiner* — Steven H Whitesell

(74) *Attorney, Agent, or Firm* — Fish & Richardson P.C.

(57)             ABSTRACT

A method for producing a mirror of a microlithographic projection exposure apparatus comprises providing a first mirror part having a first connecting surface and a second mirror part having a second connecting surface is provided. Cooling channels and/or auxiliary channels are formed in the second mirror part. The method also includes bringing together the first and second mirror parts so that initially a partial region of the first connecting surface and a partial region of the second connecting surface come into contact and form a common contact surface. The method further includes enlarging the contact surface by continuing to bring the first and second mirror parts together in a transverse direction with respect to the cooling channels or auxiliary channels.

19 Claims, 6 Drawing Sheets

(56) References Cited

U.S. PATENT DOCUMENTS

| | | | |
|---|---|---|---|
| 6,573,978 | B1 | 6/2003 | McGuire, Jr. |
| 2006/0132747 | A1 | 6/2006 | Singer et al. |
| 2006/0148129 | A1* | 7/2006 | Lim ........................ H01L 24/26 |
| | | | 438/455 |
| 2006/0286710 | A1* | 12/2006 | Sugita ...................... G02B 6/13 |
| | | | 438/455 |
| 2007/0091485 | A1 | 4/2007 | Phillips et al. |
| 2007/0155056 | A1* | 7/2007 | Kang .................. H01L 21/2007 |
| | | | 438/118 |
| 2009/0122428 | A1* | 5/2009 | Phillips .................. G02B 7/181 |
| | | | 359/846 |
| 2009/0122429 | A1 | 5/2009 | Watson et al. |
| 2015/0192856 | A1 | 7/2015 | Onvlee et al. |
| 2016/0282526 | A1* | 9/2016 | Aono .................... B29C 59/021 |
| 2018/0074303 | A1 | 3/2018 | Schwab |
| 2018/0239252 | A1 | 8/2018 | Nienhuys et al. |
| 2019/0122429 | A1 | 4/2019 | Yang et al. |
| 2020/0094487 | A1 | 3/2020 | Wahl et al. |
| 2021/0157244 | A1 | 5/2021 | Kaes et al. |
| 2021/0165336 | A1 | 6/2021 | Hofstra et al. |
| 2022/0404720 | A1* | 12/2022 | Perez-Falcon ....... G02B 7/1815 |

FOREIGN PATENT DOCUMENTS

| | | |
|---|---|---|
| DE | 10 2019 217 530 A1 | 12/2019 |
| DE | 10 2020 208 648 A1 | 1/2022 |
| EP | 1 614 008 B1 | 12/2009 |
| EP | 2 678 287 B1 | 11/2018 |
| JP | H 02257100 A | 10/1990 |
| JP | H 08201590 A | 8/1996 |
| JP | 2021-520516 A | 8/2021 |
| TW | 202013085 A | 4/2020 |
| WO | WO 03/050586 A2 | 6/2003 |
| WO | WO 03/050586 A3 | 6/2003 |
| WO | WO 2019/206637 A1 | 10/2019 |

OTHER PUBLICATIONS

Office Action in European Appln. No. 22 716 189.0, mailed on Jul. 16, 2025, 7 pages.

Office Action in Japanese Appln. No. 2023-561884, mailed on Oct. 28, 2025, 12 pages (with English translation).

Office Action in Taiwanese Appln. No. 111113266, mailed on Dec. 4, 2025, 14 pages (with English translation).

Search Report in Taiwanese Appln. No. 111113266, mailed on Nov. 27, 2025, 2 pages (with English translation).

Office Action in German Appln No. 10 2021 203 475.6, mailed on Oct. 22, 2021, 4 pages (with English translation).

Office Action in Japanese Appln. No. 2023-561884, mailed on Mar. 31, 2026, 8 pages (with English translation).

* cited by examiner

METHOD FOR PRODUCING A MIRROR OF A MICROLITHOGRAPHIC PROJECTION EXPOSURE APPARATUS

CROSS-REFERENCE TO RELATED APPLICATIONS

The present application is a continuation of, and claims benefit under 35 USC 120 to, international application PCT/EP2022/056931, filed Mar. 17, 2022, which claims benefit under 35 USC 119 of German Application No 10 2021 203 475.6, filed Apr. 8, 2021. The entire disclosure of each these applications is incorporated by reference herein.

FIELD

The disclosure relates to a method for producing a mirror of a microlithographic projection exposure apparatus. The disclosure also relates to an intermediate product for producing a mirror of a microlithographic projection exposure apparatus, to an illumination optical unit, to a projection optical unit and to a microlithographic projection exposure apparatus.

BACKGROUND

Microlithographic projection exposure apparatuses are used in particular in the production of semiconductors and generally have an illumination optical unit and a projection optical unit. The illumination optical unit generates from the light of a light source a desired light distribution for the illumination of a reticle, which is often also referred to as a mask. Light should be understood in this case in the general sense of electromagnetic radiation, i.e. there is no restriction to a specific wavelength. Accordingly, hereafter the terms "light" and "radiation" are used synonymously, i.e. a light source may also be referred to as a radiation source, a light distribution may also be referred to as a radiation distribution and so on. With the projection optical unit, the reticle is imaged onto a light-sensitive material, which is for example applied to a wafer or some other substrate, in particular of a semiconductor material. In this way, the light-sensitive material is exposed in a structured manner to a pattern predefined by the reticle. Since the reticle has tiny structural elements, which are intended to be transferred to the substrate with high precision, it is generally desirable that the illumination optical unit generates a desired light distribution relatively precisely and relatively reproducibly and the imaging by the projection optical unit takes place relatively precisely and relatively reproducibly.

In addition to further optical elements, the illumination optical unit and the projection optical unit may have in the light path at least one mirror, which deflects the light in a predefined way by reflection at its optical surface. How the light deflection specifically takes place generally depends on the formation of the optical surface, in particular on its form. The optical surface may for example be formed as a metallic layer or as a series of layers with alternating refractive indices.

It can be desirable to form the mirror from more than one part, for example if the mirror is intended to have cooling channels or if the mirror is intended to be larger than the material blanks available for the production of the mirror.

A multipart mirror with cooling channels is known from DE 102020208648.6, which is not a prior publication.

A potential issue with mirrors that are formed from more than one part is that of connecting the individual parts of the mirror in such a way that meets the high desired properties for lithographic optical parts. By way of example, a difficulty arising when connecting the mirror parts is that of bringing the mirror parts very close to one another with high precision.

SUMMARY

The disclosure seeks to simplify the production of a mirror of a microlithographic projection exposure apparatus and to allow the connection of two mirror parts with a high level of precision and reproducibility.

Furthermore, it is generally desirable for the mirror parts to be brought together in very controlled fashion. In particular, forming a given level of approach at different locations of the brought-together surfaces of the mirror parts in accordance with a given timing should be facilitated. However, an uncontrolled approach and, resulting therefrom, spontaneous optical contact bonding of the mirror parts at locations of the brought-together surfaces which are not yet scheduled for optical contact bonding at the given time is desirably prevented. Likewise, simultaneous global optical contact bonding over all of the brought-together surfaces is desirably prevented.

In a method according to the disclosure for producing a mirror of a microlithographic projection exposure apparatus, a first mirror part having a first connecting surface is provided, as is a second mirror part having a second connecting surface. Cooling channels and/or auxiliary channels are formed in the second mirror part. The first mirror part and the second mirror part are brought together in such a way that initially a partial region of the first connecting surface and a partial region of the second connecting surface come into contact and form a common contact surface, and the contact surface is enlarged by continuing to bring the first mirror part and the second mirror part together in a transverse direction with respect to the cooling channels or auxiliary channels.

The method can allow for the production of a mirror of a lithography system to be simplified and two mirror parts can be connected together with a high level of precision and reproducibility. Using a method according to the disclosure, the second mirror part can be optically contact bonded onto the first mirror part in a highly controlled manner, i.e. be connected to the first mirror part due to van der Waals forces between the material of the second mirror part and the material of the first mirror part in the region of the common contact surface. Uncontrolled optical contact bonding and simultaneous global optical contact bonding can be reliably prevented. Instead, there is successive optical contact bonding by a time-sequential, continuous bringing-together of different locations on the connecting surfaces of the mirror parts. This continuous bringing-together is made simpler by virtue of the first mirror part and the second mirror part being brought together in a transverse direction with respect to the cooling channels or auxiliary channels. In this direction, the deformability of the second mirror part can be increased as a result of the material weakening that accompanies the cooling channels and/or auxiliary channels, and so the formation of a respectively desired shape can be simplified.

Bringing-together the first mirror part and the second mirror part in a transverse direction with respect to the cooling channels or auxiliary channels may be present, for example, if the angle between this direction and the cooling channels or auxiliary channels is more than 45°, optionally more than 60°, such as more than 75°, for example more than 85° or in particular 90°.

The transitional zone between the common contact surface, within which the second mirror part has already been optically contact bonded onto the first mirror part, and the region of the first and second connecting surfaces not optically contact bonded is also referred to as the optical contact bond front. Continuing to bring together the first mirror part and the second mirror part can have the effect that the optical contact bond front moves in a desired direction in a controlled manner. This successive optical contact bonding can mean that the relative alignment of the two mirror parts in relation to one another can be controlled very exactly during the entire optical contact bonding operation and undesired spontaneous optical contact bonding can be avoided. Furthermore, at any time in the optical contact bonding operation there is a connection between the region of the optical contact bond front and the surrounding area, and so an escape of gas from this region is generally ensured at any time and gas inclusions between the connecting surfaces can be largely prevented.

The first mirror part and the second mirror part may be brought together in such a way that contact with the first mirror part first occurs in a region of the second connecting surface that adjoins the outer contour of the second mirror part. It is similarly also possible to bring the first mirror part and the second mirror part together in such a way that contact with the first mirror part first occurs in the region of the centre of the second connecting surface. This can allow the way in which the optical contact bonding operation is carried out to be made to suit the respective circumstances, in particular the formation of the second mirror part.

On a side of the second mirror part that is facing away from the second connecting surface, a region for formation of an optical surface may be provided.

The first connecting surface of the first mirror part and/or the second connecting surface of the second mirror part may have a curvature. A curved first connecting surface and/or second connecting surface can be desirable in particular when it is envisaged to form a curved optical surface on the second mirror part, because then for example a constant thickness is possible, and therefore a uniform deformability of the second mirror part. Furthermore, a constant distance between the cooling channels and the optical surface can then be created with little effort. The curvature can correspond to the curvature of the envisaged optical surface of the mirror.

There is also the possibility that the first mirror part has a first connecting surface which is formed in a planar manner or has a large mean radius of curvature, in particular a mean radius of curvature of more than 10 m. Then a thin second mirror part can be used, in particular a second mirror part with a thickness of 0.5 to 10 mm, which has a second connecting surface formed in a planar manner. If the second mirror part has cooling channels or auxiliary channels, the thickness is determined from the bottom of the cooling channels or auxiliary channels. Such a thin second mirror part can mean that its second connecting surface can be deformed and, as a result, adapted to the form of the first connecting surface of the first mirror part. This means that there may be no need for the effort of producing a second mirror part with a curved second connecting surface.

With respect to a wavelength $\lambda$, of 633 nm, the form of the first connecting surface of the first mirror part and/or the second connecting surface of the second mirror part may deviate from a predefined form by less than $\lambda/2$, such as less than $\lambda/10$. The first connecting surface of the first mirror part and/or the second connecting surface of the second mirror part may have a roughness of less than 5 nm, such as less than 1 nm. The term "roughness" in this case subsumes the randomly distributed deviations from a smooth surface. Precisely shaped and smooth connecting surfaces typically make optical contact bonding easier, reduce the risk of gas inclusions and increase the load-bearing capacity of the connection. Before the optical contact bonding, one of the two connecting surfaces may be adapted to the actual shape of the other of the two connecting surfaces. In this way, the precision can be increased still further.

There is the possibility that the curvature of the first connecting surface is formed convexly and the curvature of the second connecting surface is formed concavely or the curvature of the first connecting surface is formed concavely and the curvature of the second connecting surface is formed convexly and, while the first mirror part and the second mirror part are being brought together, the convex curvature has a mean radius of curvature of which the absolute value is less than the absolute value of the mean radius of curvature of the concave curvature. This can mean that a locally sequential optical contact bonding can be ensured, because the distance between the two connecting surfaces increases with increasing distance from the optical contact bond front. The risk of undesired optical contact bonding at a distance from the optical contact bond front can be reduced. Furthermore, the risk of gas inclusions can be reduced.

The different absolute values of the mean radii of curvature of the convex curvature and the concave curvature while the first mirror part and the second mirror part are being brought together may be generated by processing the first mirror part and/or the second mirror part before bringing together the first mirror part and the second mirror part or by exerting a force on the second mirror part while the first mirror part and the second mirror part are being brought together.

There is the possibility that the curvature of the first connecting surface of the first mirror part is not formed rotationally symmetrically, and so it has different mean radii of curvature, and/or the curvature of the second connecting surface of the second mirror part is not formed rotationally symmetrically, and so it has different mean radii of curvature.

The first mirror part and the second mirror part can continue to be brought together along a direction in which the first connecting surface of the first mirror part and/or the second connecting surface of the second mirror part have/ has the mean radius of curvature with the smallest absolute value. Accordingly, optical contact bonding can be performed along the smallest mean radius of curvature. This can mean that with respect to bringing the connecting surfaces together and with respect to venting. Furthermore, the cooling channels and/or the auxiliary channels may extend transversely to the direction in which the first connecting surface of the first mirror part and/or the second connecting surface of the second mirror part have/has the mean radius of curvature with the smallest absolute value.

Cooling channels that are formed as open towards the first connecting surface of the first mirror part may be arranged in the first mirror part. Bringing-together the first mirror part and the second mirror part can be continued in such a way that the contact surface is enlarged in a direction parallel to the cooling channels of the first mirror part. This can simplify venting the region between the first connecting surface of the first mirror part and the second connecting surface of the second connecting part.

The cooling channels and/or the auxiliary channels of the second mirror may be formed as open towards the second connecting surface of the second mirror part. In this case, the auxiliary channels can mean that good deformability is ensured during the optical contact bonding, even in regions of the second mirror part where no cooling channels are formed.

The cooling channels may be arranged in each case with the greatest part of their longitudinal extent laterally within the region intended for the optical surface. This can make possible efficient cooling of the region that has a particularly great influence on a temperature-induced deformation of the optical surface. In this case, each auxiliary channel may lie with the greatest part of its longitudinal extent laterally outside the region for the formation of the optical surface.

Furthermore, the cooling channels may run parallel to the optical surface. This can make particularly uniform cooling of the optical surface possible. In particular, the cooling channels may extend to the optical surface to within a distance of 1 to 6 mm. Typically, the shape deviation between the second connecting surface of the second mirror part and the optical surface may be at most 3 mm, such as no more than 200 μm.

The cooling channels and the auxiliary channels can have a substantially identical orientation at least in pairs. In this way, the auxiliary channels can act as a continuation of the cooling channels.

The auxiliary channels can be formed separately from the cooling channels. The auxiliary channels can be fluidically separate from the cooling channels. As a result, any negative effects on the fluid flow through the cooling channels can be avoided.

Provision can furthermore be made for the auxiliary channels to be fluidically connected to the environment of the mirror. This can make it easier to vent the region between the first mirror part and the second mirror part during production and makes pressure equalization with the environment possible in the finished mirror and prevents the formation of pressure differences and associated undesirable mechanical effects. Alternatively, it is possible to separate the auxiliary channels from the environment of the mirror. In this way, contaminants can be prevented from entering the auxiliary channels and/or from passing from the auxiliary channels into the environment and, for example, contaminating the optical surface. For example, the auxiliary channels can be separated from the environment of the mirror by way of a flexible membrane. While this creates a fluidic separation, it does permit some coupling of the pressure. In this way, pressure equalization between the interior of the auxiliary channels and the environment of the mirror can be possible to some extent. However, it can be possible to realize an even stronger separation of the auxiliary channels from the environment, which also brings about decoupling with regards to pressure. In this variant, there is also the possibility to set in the interior of the auxiliary channels, independently of the ambient pressure, a desired pressure that, for example, leads to a deformation of the optical surface of the mirror and in this way to implement a pressure-controlled manipulator. The separation of the auxiliary channels from the environment of the mirror typically takes place only after the mirror parts have been connected so as not to adversely affect the venting taking place via the auxiliary channels during the connection of the mirror parts.

There likewise is also the possibility that the auxiliary channels are formed as open towards a side of the second mirror part which is provided to form an optical surface. The position of possible cooling channels need not be considered in this embodiment.

The auxiliary channels may be filled with a material that differs from the material of the second mirror part while the first mirror part and the second mirror part are brought together. The second mirror part can be better handled since a closed surface offers a greater surface of attack. Moreover, the risk of breakouts at the edges can be reduced since the filling material protects the edges next to the auxiliary channels. In particular, the auxiliary channels may be filled with an elastic material. The increased deformability of the second mirror part resulting from the auxiliary channels can be largely maintained. The filling material may be removed again prior to heat treatment of the mirror parts for forming a connection that can be subjected to very high stresses.

The auxiliary channels can be levelled out before the optical surface is formed. As a result, a suitable substrate for the formation of the optical surface may be created. The auxiliary channels may be levelled out by way of material ablation, for example by milling, grinding, polishing, etc. In comparison with a form of the second mirror part that is thin from the outset and has no auxiliary channels, the temporary auxiliary channels can mean that a global high mechanical stability is combined with instances of local material weakening, which are formed in a targeted manner, for obtaining an easy deformability in selected directions.

The cooling channels and/or the auxiliary channels may have a linear profile. In particular, the cooling channels and/or the auxiliary channels may be arranged equidistantly from one another. The clear distance between adjacent cooling channels and/or auxiliary channels may be 15 mm or less. The cooling channels and/or the auxiliary channels may extend laterally from a region near the outer contour of the second mirror part to a diametrically opposite region near the outer contour of the second mirror part. In the case of such a formation of the cooling channels and/or auxiliary channels, it can be desirable for the first mirror part and the second mirror part to be brought together in such a way that contact with the second mirror part first occurs in a region of the second connecting surface that adjoins the outer contour of the second mirror part.

In one configuration, the clear distance between adjacent cooling channel openings is not more than 15 mm. In some cases, the clear distance between adjacent cooling channel openings is not more than 5 mm. Small distances between the cooling channel openings can make the deformability during optical contact bonding easier.

The transverse dimensions of the cooling channels may be 0.2 to 10 mm. The depth of the cooling channels, i.e. the transverse dimension approximately perpendicular to the first connecting surface of the first mirror part or to the second connecting surface of the second mirror part, may be greater than the width of the cooling channels, i.e. the transverse dimension perpendicular to the depth. In particular, the depth of the cooling channels may be more than twice the width of the cooling channels. As a result, with the same flow cross section, there can be a smaller risk of a deformation of the optical surface of the mirror due to the pressure of the fluid in the cooling channels, because the proportion of the surface area of the cavities formed by the cooling channels parallel to the optical surface is smaller than in the case of wide cooling channels that have a small depth.

There is also the possibility that the cooling channels and/or the auxiliary channels have a ring-shaped embodiment or are formed in accordance with ring segments. In particular, the cooling channels and/or the auxiliary channels may have an annular embodiment or be formed in accordance with annular segments. However, it is also possible to form the cooling channels and/or the auxiliary channels in accordance with other curved curves.

At least some of the cooling channels and/or the auxiliary channels may be nested within one another in the radial direction. In particular, at least some of the cooling channels and/or the auxiliary channels may be arranged concentrically. In the case of such a formation of the cooling channels and/or auxiliary channels, it can be desirable for the first mirror part and the second mirror part to be brought together in such a way that contact with the first mirror part first occurs in the region of the centre of the second connecting surface.

The first mirror part may have a greater thickness than the second mirror part. This can make efficient cooling of the optical surface possible, and at the same time can permit a great mechanical stability of the mirror.

After optical contact bonding, the first mirror part and the second mirror part can be connected to one another by way of bonding. Bonding permits a very strong and permanent connection that can be established with acceptable outlay. Using bonding, the material of the first mirror part can be directly connected to the material of the second mirror part. In this way, certain disadvantages occurring when using adhesives can be avoided. In particular, bonding can bring about covalent bonds between the material of the first mirror part and the material of the second mirror part. Bonding may be carried out at very high temperatures, in particular at temperatures between the anneal point and the softening point of the material of the first and second mirror part. This may reduce possible local stresses which may arise as a result of the transversely extending cooling channels and/or auxiliary channels when optically contact bonding the first and second mirror part. By way of example, temperatures between 1200° C. and 1400° C. may be provided. Alternatively or in addition, a similar effect can be achieved by virtue of the optical contact bonding being performed by means of a robot and a particularly uniform optical contact bonding speed.

Levelling out of the auxiliary channels may be undertaken following the bonding.

The disclosure further relates to an intermediate product for producing a mirror of a microlithographic projection exposure apparatus. The intermediate product is in the form of a second mirror part which has a second connecting surface formed such that it can be optically contact bonded onto a first connecting surface of a first mirror part. The second mirror part can have auxiliary channels on its side opposite to the second connecting surface.

The intermediate product can mean that, firstly, it is sufficiently mechanically stable overall for mechanical processing and handling and, secondly, it is sufficiently deformable in a selected direction or in a plurality of selected directions on account of the instances of material weakening caused by the auxiliary channels.

The auxiliary channels may be formed as depressions that are open to the surroundings. The auxiliary channels may each be formed as open to the surroundings over the majority of their extent on the side of the second mirror part opposite to the second connecting surface, in particular over their entire extent. This renders the production of the auxiliary channels substantially easier as this may be implemented with the aid of milling or grinding tools, for example.

Moreover, the disclosure relates to a mirror of a lithography system, comprising a first mirror part, a second mirror part, an optical surface for reflecting light, a plurality of cooling channels and/or a plurality of auxiliary channels, the first mirror part and the second mirror part being rigidly connected to one another in the region of a first connecting surface of the first mirror part and a second connecting surface of the second mirror part, the first connecting surface of the first mirror part and/or the second connecting surface of the second mirror part having a curvature that is not formed rotationally symmetrically, and so it has different mean radii of curvature, the cooling channels and/or the auxiliary channels extending transversely to a direction in which the first connecting surface of the first mirror part and/or the second connecting surface of the second mirror part have/has the mean radius of curvature with the smallest absolute value.

Furthermore, the disclosure relates to an illumination optical unit comprising a mirror which was produced in accordance with the method according to the disclosure and/or using the intermediate product according to the disclosure.

Moreover, the disclosure relates to a projection optical unit comprising a mirror which was produced in accordance with the method according to the disclosure and/or using the intermediate product according to the disclosure.

In addition, the disclosure relates to a microlithographic projection exposure apparatus comprising an illumination optical unit according to the disclosure and/or a projection optical unit according to the disclosure.

BRIEF DESCRIPTION OF THE DRAWINGS

The disclosure is explained in more detail below on the basis of the exemplary embodiments that are represented in the drawings, in which.

DETAILED DESCRIPTION

Figure 1:
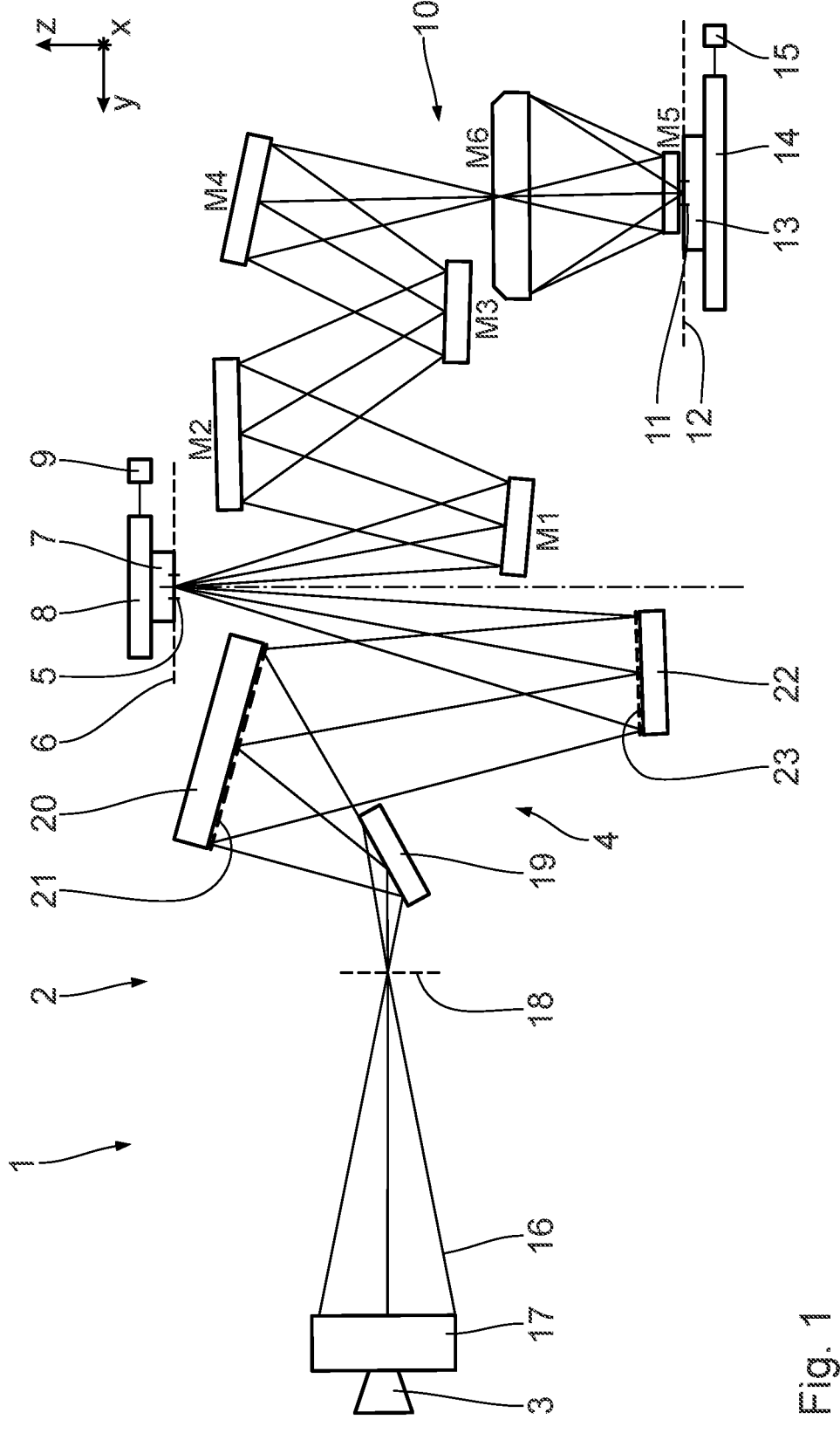
FIG. 1 schematically shows an exemplary embodiment of a projection exposure apparatus for EUV projection lithography in a meridional section.

FIG. 1 schematically shows an exemplary embodiment of a projection exposure apparatus 1 for EUV projection lithography in a meridional section.

In the following text, certain component parts of a microlithographic projection exposure apparatus 1 are first described by way of example with reference to FIG. 1. The description of the basic construction of the projection exposure apparatus 1 and its components should not be understood here as limiting.

One embodiment of an illumination system 2 of the projection exposure apparatus 1 has, in addition to a light or radiation source 3, an illumination optical unit 4 for illuminating an object field 5 in an object plane 6. In an alternative embodiment, the radiation source 3 may also be provided as a separate module from the remaining illumination system. In this case, the illumination system does not comprise the radiation source 3.

A reticle 7 arranged in the object field 5 is exposed. The reticle 7 is held by a reticle holder 8. The reticle holder 8 is displaceable by way of a reticle displacement drive 9, in particular in a scanning direction.

For purposes of explanation, a Cartesian xyz-coordinate system is shown in FIG. 1. The x-direction runs perpendicularly into the plane of the drawing. The y-direction runs horizontally and the z-direction runs vertically. The scanning direction runs along the y-direction in FIG. 1. The z-direction runs perpendicular to the object plane 6. The projection exposure apparatus 1 comprises a projection optical unit 10. The projection optical unit 10 serves for imaging the object field 5 into an image field 11 in an image plane 12. The image plane 12 runs parallel to the object plane 6. Alternatively, an angle between the object plane 6 and the image plane 12 that differs from 0° is also possible.

A structure on the reticle 7 is imaged onto a light-sensitive layer of a wafer 13 arranged in the region of the image field 11 in the image plane 12 or some other substrate. The wafer 13 is held by a wafer holder 14. The wafer holder 14 is displaceable by way of a wafer displacement drive 15, in particular along the y-direction. The displacement on the one hand of the reticle 7 by way of the reticle displacement drive 9 and on the other hand of the wafer 13 by way of the wafer displacement drive 15 can take place in such a way as to be synchronized with one another.

The radiation source 3 is an EUV radiation source. The radiation source 3 emits an illumination radiation 16, which is also referred to below as used radiation or illumination light. In the exemplary embodiment shown, the illumination radiation 16 has a wavelength in the EUV range, in particular in the range between 5 nm and 30 nm. The radiation source 3 may be a plasma source, for example an LPP source (Laser Produced Plasma) or a GDPP source (Gas Discharge Produced Plasma). It may also be a synchrotron-based radiation source. Similarly, the radiation source 3 may be a free electron laser (FEL).

The illumination radiation 16 emerging from the radiation source 3 is focused by a collector 17. The collector 17 may be a collector with one or with more ellipsoidal and/or hyperboloidal reflection surfaces. The illumination radiation 16 can be incident on the at least one reflection surface of the collector 17 with grazing incidence (GI), that is to say at angles of incidence of greater than 45°, or with normal incidence (NI), that is to say at angles of incidence of less than 45°. The collector 17 may be structured and/or coated, on the one hand for optimizing its reflectivity for the illumination radiation 16 and on the other hand for suppressing extraneous light.

Downstream of the collector 17, the illumination radiation 16 propagates through an intermediate focus in an intermediate focal plane 18. The intermediate focal plane 18 can represent a separation between a radiation source module, having the radiation source 3 and the collector 17, and the illumination optical unit 4.

The illumination optical unit 4 comprises a deflection mirror 19 and, arranged downstream thereof in the beam path, a first facet mirror 20. The deflection mirror 19 can be a plane deflection mirror or, alternatively, a mirror with a beam-influencing effect that goes beyond the purely deflecting effect. Alternatively or in addition, the deflection mirror 19 can be in the form of a spectral filter which separates a used light wavelength of the illumination radiation 16 from extraneous light with a wavelength deviating therefrom. If the first facet mirror 20 is arranged in a plane of the illumination optical unit 4 that is optically conjugate to the object plane 6 as a field plane, it is also referred to as a field facet mirror. The first facet mirror 20 comprises a multiplicity of individual first facets 21, which are also referred to below as field facets. Only some of these first facets 21 are shown in FIG. 1 by way of example.

The first facets 21 can be in the form of macroscopic facets, in particular as rectangular facets or as facets with an arcuate peripheral contour or a peripheral contour of part of a circle. The first facets 21 may be in the form of plane facets or alternatively as convexly or concavely curved facets.

As known for example from DE 10 2008 009 600 A1, the first facets 21 themselves may also be composed in each case of a multiplicity of individual mirrors, in particular a multiplicity of micromirrors. The first facet mirror 20 may in particular be formed as a microelectromechanical system (MEMS system). For details, reference is made to DE 10 2008 009 600 A1.

Between the collector 17 and the deflection mirror 19, the illumination radiation 16 travels horizontally, that is to say along the y-direction.

In the beam path of the illumination optical unit 4, a second facet mirror 22 is arranged downstream of the first facet mirror 20. If the second facet mirror 22 is arranged in a pupil plane of the illumination optical unit 4, it is also referred to as a pupil facet mirror. The second facet mirror 22 can also be arranged at a distance from a pupil plane of the illumination optical unit 4. In this case, the combination of the first facet mirror 20 and the second facet mirror 22 is also referred to as a specular reflector. Specular reflectors are known from US 2006/0132747 A1, EP 1 614 008 B1 and U.S. Pat. No. 6,573,978.

The second facet mirror 22 comprises a plurality of second facets 23. In the case of a pupil facet mirror, the second facets 23 are also referred to as pupil facets. The second facets 23 can likewise be macroscopic facets, which can, for example, have a round, rectangular or hexagonal boundary, or alternatively be facets composed of micromirrors. In this regard, reference is likewise made to DE 10 2008 009 600 A1.

The second facets 23 can have plane or alternatively convexly or concavely curved reflection surfaces.

The illumination optical unit 4 consequently forms a doubly faceted system. This basic principle is also referred to as a fly's eye integrator.

It can be desirable to arrange the second facet mirror 22 not exactly in a plane that is optically conjugate to a pupil plane of the projection optical unit 10. In particular, the second facet mirror 22 may be arranged so as to be tilted in relation to a pupil plane of the projection optical unit 10, as is described for example in DE 10 2017 220 586 A1.

With the aid of the second facet mirror 22, the individual first facets 21 are imaged into the object field 5 The second facet mirror 22 is the last beam-shaping mirror or else, in fact, the last mirror for the illumination radiation 16 in the beam path upstream of the object field 5.

In a further embodiment, not shown, of the illumination optical unit 4, a transfer optical unit contributing in particular to the imaging of the first facets 21 into the object field 5 can be arranged in the beam path between the second facet mirror 22 and the object field 5. The transfer optical unit can have exactly one mirror or else alternatively two or more mirrors, which are arranged one behind the other in the beam path of the illumination optical unit 4. The transfer optical unit can in particular comprise one or two normal-incidence mirrors (NI mirrors) and/or one or two grazing-incidence mirrors (GI mirrors).

In the embodiment shown in FIG. 1, the illumination optical unit 4 has exactly three mirrors downstream of the collector 17, specifically the deflection mirror 19, the first facet mirror 20 and the second facet mirror 22.

In a further embodiment of the illumination optical unit 4, there is also no need for the deflection mirror 19, and so the illumination optical unit 4 can then have exactly two mirrors downstream of the collector 17, specifically the first facet mirror 20 and the second facet mirror 22.

As a rule, the imaging of the first facets 21 into the object plane 6 by means of the second facets 23 or using the second facets 23 and a transfer optical unit is only approximate imaging.

The projection optical unit 10 comprises a plurality of mirrors Mi, which are consecutively numbered in accordance with their arrangement in the beam path of the projection exposure apparatus 1.

In the example shown in FIG. 1, the projection optical unit 10 comprises six mirrors M1 to M6. Alternatives with four, eight, ten, twelve or any other number of mirrors M1 are similarly possible. The projection optical unit 10 is a twice-obscured optical unit. The last-but-one mirror M5 and the last mirror M6 have in each case a through-opening, through which, during the exposure of the wafer 13, the radiation contributing to the exposure passes on its way from the reticle 7 to the wafer 13. The projection optical unit has an image-side numerical aperture that is greater than 0.5 and may also be greater than 0.6, and may be for example 0.7 or 0.75.

The reflection surfaces of the mirrors M1 may be in the form of freeform surfaces without an axis of rotational symmetry. Alternatively, the reflection surfaces of the mirrors M1 can be designed as aspherical surfaces with exactly one axis of rotational symmetry of the reflection surface shape. Just like the mirrors of the illumination optical unit 4, the mirrors M1 can have highly reflective coatings for the illumination radiation 16. These coatings can be designed as multilayer coatings, in particular with alternating layers of molybdenum and silicon.

The projection optical unit 10 has a large object-image offset in the y-direction between a y-coordinate of a centre of the object field 5 and a y-coordinate of the centre of the image field 11. This object-image offset in the y-direction may be approximately the same size as a z-distance between the object plane 6 and the image plane 12.

In particular, the projection optical unit 10 can have an anamorphic form. In particular, it has different imaging scales $\beta x$, $\beta y$ in the x- and y-directions. The two imaging scales $\beta x$, $\beta y$ of the projection optical unit 10 can be ($\beta x$, ($\beta y$)=(+/−0.25, +/−0.125). A positive imaging scale $\beta$ means imaging without image inversion. A negative sign for the imaging scale $\beta$ means imaging with image inversion.

The projection optical unit 10 consequently leads to a reduction in size with a ratio of 4:1 in the x-direction, that is to say in a direction perpendicular to the scanning direction.

The projection optical unit 10 leads to a reduction in size of 8:1 in the y-direction, that is to say in the scanning direction.

Other imaging scales are similarly possible. Imaging scales with the same sign and the same absolute value in the x-direction and y-direction are also possible, for example with absolute values of 0.125 or of 0.25.

The number of intermediate image planes in the x-direction and in the y-direction in the beam path between the object field 5 and the image field 11 can be the same or, depending on the embodiment of the projection optical unit 10, can differ. Examples of projection optical units 10 with different numbers of such intermediate images in the x-direction and y-direction are known from US 2018/0074303 A1.

In each case one of the second facets 23 is assigned to exactly one of the first facets 21 for respectively forming an illumination channel for illuminating the object field 5. This may in particular produce illumination according to the Köhler principle. The far field is decomposed into a multiplicity of object fields 5 with the aid of the first facets 21. The first facets 21 produce a plurality of images of the intermediate focus on the second facets 23 respectively assigned to them.

By way of an assigned second facet 23, the first facets 21 are in each case imaged onto the reticle 7 in a manner superposed on one another for the purposes of illuminating the object field 5. The illumination of the object field 5 is in particular as homogeneous as possible. It can have a uniformity error of less than 2%. The field uniformity can be achieved by way of the superposition of different illumination channels.

The illumination of the entrance pupil of the projection optical unit 10 can be defined geometrically by an arrangement of the second facets 23. The intensity distribution in the entrance pupil of the projection optical unit 10 can be set by selecting the illumination channels, in particular the subset of the second facets 23, which guide light. This intensity distribution is also referred to as illumination setting or illumination pupil filling.

A likewise desirable pupil uniformity in the region of sections of an illumination pupil of the illumination optical unit 4 which are illuminated in a defined manner can be achieved by a redistribution of the illumination channels.

Further aspects and details of the illumination of the object field 5 and in particular of the entrance pupil of the projection optical unit 10 are described below.

In particular, the projection optical unit 10 can have a homocentric entrance pupil. The latter can be accessible. It can also be inaccessible.

The entrance pupil of the projection optical unit 10 frequently cannot be exactly illuminated with the second facet mirror 22. When imaging the projection optical unit 10, which images the centre of the second facet mirror 22 telecentrically onto the wafer 13, the aperture rays often do not intersect at a single point. However, it is possible to find an area in which the distance of the aperture rays determined in pairs becomes minimal. This area represents the entrance pupil or an area in real space that is conjugate thereto. In particular, this area has a finite curvature.

It may be the case that the projection optical unit 10 has different positions of the entrance pupil for the tangential beam path and for the sagittal beam path. In this case, an imaging element, in particular an optical component part of the transfer optical unit, should be provided between the second facet mirror 22 and the reticle 7. With the aid of this optical element, the different positions of the tangential entrance pupil and the sagittal entrance pupil can be taken into account.

In the arrangement of the components of the illumination optical unit 4 shown in FIG. 1, the second facet mirror 22 is arranged in an area conjugate to the entrance pupil of the projection optical unit 10. The first facet mirror 20 is arranged so as to be tilted in relation to the object plane 6. The first facet mirror 20 is arranged so as to be tilted in relation to an arrangement plane defined by the deflection mirror 19.

The first facet mirror 20 is arranged so as to be tilted with respect to an arrangement plane defined by the second facet mirror 22.

Figure 2:
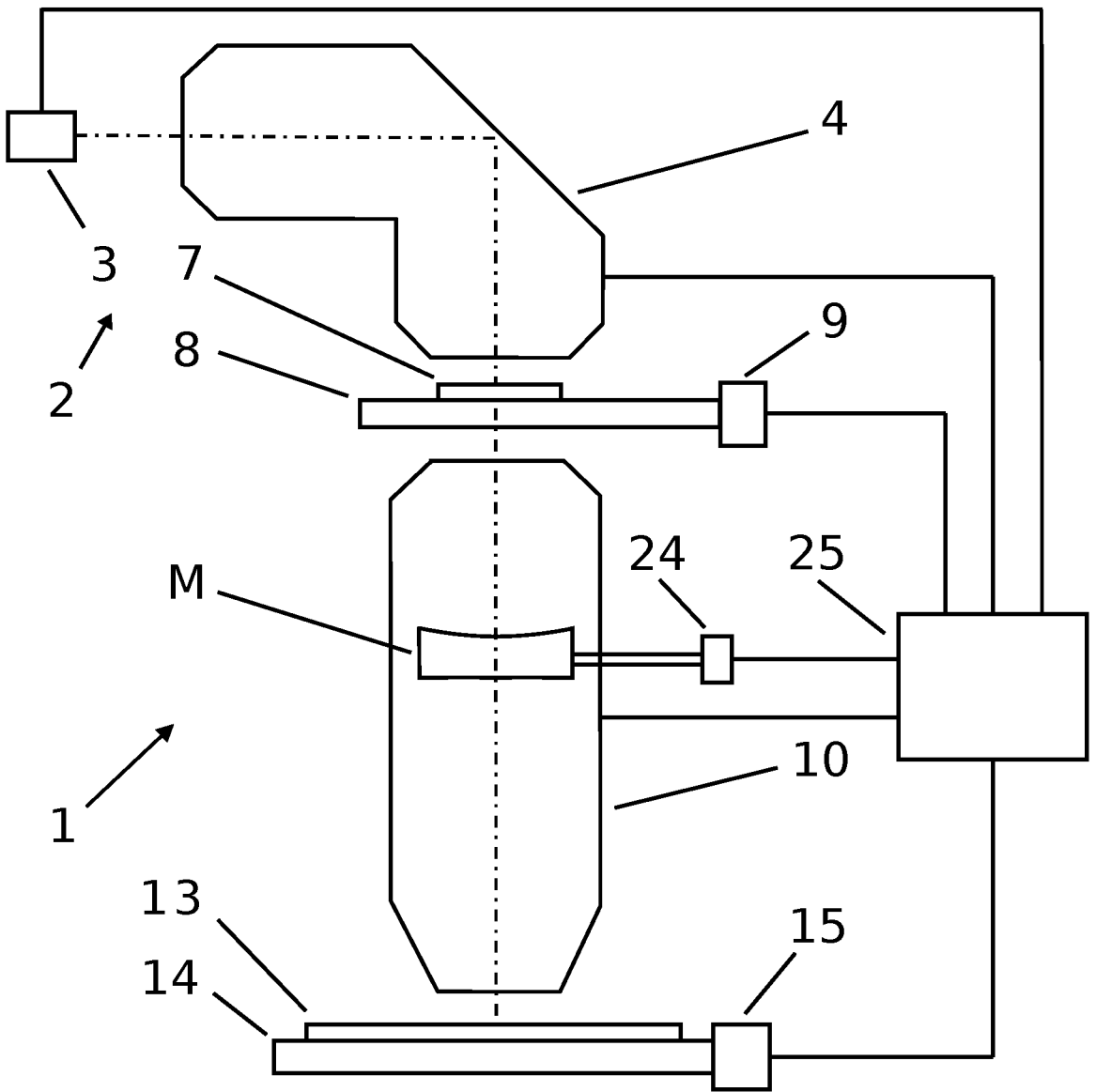
FIG. 2 shows an exemplary embodiment of a projection exposure apparatus for DUV projection lithography in a schematic illustration.

FIG. 2 shows an exemplary embodiment of a projection exposure apparatus 1 for DUV projection lithography in a schematic illustration. Here, DUV denotes "deep ultraviolet". In particular, the projection exposure apparatus 1 may be designed for operation at a wavelength of 193 nm.

The projection exposure apparatus 1 has an illumination optical unit 4 and a projection optical unit 10. The internal structure of the illumination optical unit 4 and the internal structure of the projection optical unit 10, which may in each case comprise for example optical components, sensors, manipulators etc., are not shown in detail. In the case of the projection optical unit 10, a mirror M is indicated as representative of its optical components. The mirror M may be cooled with the aid of a cooling medium, which is provided by a cooling device 24. The cooling medium is a fluid, for example water. In addition or alternatively, the illumination optical unit 4 may have a cooled mirror M and an associated cooling device 24. The projection optical unit 10 and/or the illumination optical unit 4 may also have a plurality of cooled mirrors M and cooling devices 24. In the case of the illumination optical unit 4 and in the case of the projection optical unit 10, lenses and further mirrors—cooled or uncooled—may for example be present as further optical components.

By analogy, at least one cooling device 24, which may for example be connected to the mirror M3, may also be provided in the exemplary embodiment of the projection exposure apparatus 1 shown in FIG. 1.

The radiation used in the operation of the projection exposure apparatus 1 is generated by a radiation source 3. The radiation source 3 may be in particular an excimer laser, for example an argon fluoride laser, which generates illumination radiation 16 of the wavelength 193 nm.

Arranged between the illumination optical unit 4 and the projection optical unit 10 is a reticle holder 8, fixed on which is a reticle 7, also referred to as a mask. The reticle holder 8 has a reticle displacement drive 9. Arranged downstream of the projection optical unit 10, seen in the direction of radiation, is a wafer holder 14, which carries a wafer 13 or some other substrate and has a wafer displacement drive 15.

Also shown furthermore in FIG. 2 is a control device 25, which is connected to the illumination optical unit 4, the projection optical unit 10, the cooling device 24, the radiation source 3, the reticle holder 8 or the reticle displacement drive 9 and the wafer holder 14 or the wafer displacement drive 15. By analogy, the projection exposure apparatus of FIG. 1 may likewise have a control device 25, which may be connected to corresponding components.

The projection exposure apparatus 1 serves the purpose of imaging the reticle 7 onto the wafer 13 with high precision. For this purpose, the reticle 7 is illuminated with the aid of the illumination optical unit 4 and the illuminated reticle 7 is imaged onto the wafer 13 with the aid of the projection optical unit 10. Specifically, the following procedure is adopted:

The illumination optical unit 4 transforms the illumination radiation 16 generated by the radiation source 3 in an exactly defined way by means of its optical components and guides it onto the reticle 7. Depending on the embodiment, the illumination optical unit 4 may be formed in such a way that it illuminates the entire reticle 7 or only a partial region of the reticle 7. The illumination optical unit 4 is capable of illuminating the reticle 7 in such a way that there are almost identical illumination conditions at each illuminated point of the reticle 7. In particular, the intensity and the angular distribution of the incident illumination radiation 16 are almost identical for each illuminated point of the reticle 7.

The illumination optical unit 4 is capable of illuminating the reticle 7 optionally with illumination radiation 16 of a multiplicity of different angular distributions. These angular distributions of the illumination radiation 16 are also referred to as illumination settings. The desired illumination setting is generally selected in dependence on the structural elements formed on the reticle 7. Used relatively often for example are dipole or quadrupole illumination settings, in the case of which the illumination radiation 16 is incident on each illuminated point of the reticle 7 from two different directions or from four different directions, respectively. Depending on the form of the illumination optical unit 4, the different illumination settings may be produced for example by means of different diffractive optical elements in combination with a zoom axicon optical unit or by means of mirror arrays, which have in each case a multiplicity of small mirrors that are arranged next to one another and are individually adjustable with respect to their angular position.

The reticle 7 may be formed for example as a glass plate, which is transparent to the illumination radiation 16 supplied by the illumination optical unit 4 and applied to which are opaque structures, for example in the form of a chromium coating. The projection exposure apparatus 1 may be formed in such a way that the entire reticle 7 is illuminated at the same time by the illumination optical unit 4 and is imaged completely onto the wafer 13 by the projection optical unit 10 in a single exposure step.

Alternatively, the projection exposure apparatus 1 may also be formed in such a way that only a partial region of the reticle 7 is illuminated at the same time by the illumination optical unit 4 and the reticle displacement drive 9 is activated by the control device 25 in such a way that, during the exposure of the wafer 13, the reticle 7 is moved in relation to the illumination optical unit 4 and, as a result, the illuminated partial region migrates over the reticle 7 as a whole. The wafer 13 is moved synchronously by a suitably adjusted activation of the wafer displacement drive 15, in which the imaging properties of the projection optical unit 10 are also taken into account, and so the respectively illuminated partial region of the reticle 7 is imaged onto a partial region of the wafer 13 provided for it. This movement of the reticle 7 and the wafer 13 is also referred to as scanning.

In order to be able to transfer the latent image produced by the exposure of the wafer 13 in both embodiments of the projection exposure apparatus 1 into a physical structure, a light-sensitive layer is applied to the wafer 13. The image of the reticle 7 is formed in this light-sensitive layer by exposure and a permanent structure can be produced from it on the wafer 13 with the aid of subsequent chemical processes.

The reticle 7 is generally imaged onto the wafer 13 not only once, but multiple times next to one another. For this purpose, after each imaging of the reticle 7 onto the wafer 13, the wafer holder 14 is displaced laterally in a way corresponding to the size of the image of the reticle 7 on the wafer 13. The imaging of the reticle 7 may be performed here in each case as a whole or sequentially by scanning. The chemical treatment of the wafer 13 is only started when the desired number of imagings of the reticle 7 onto the wafer 13 have been carried out.

Figure 3:
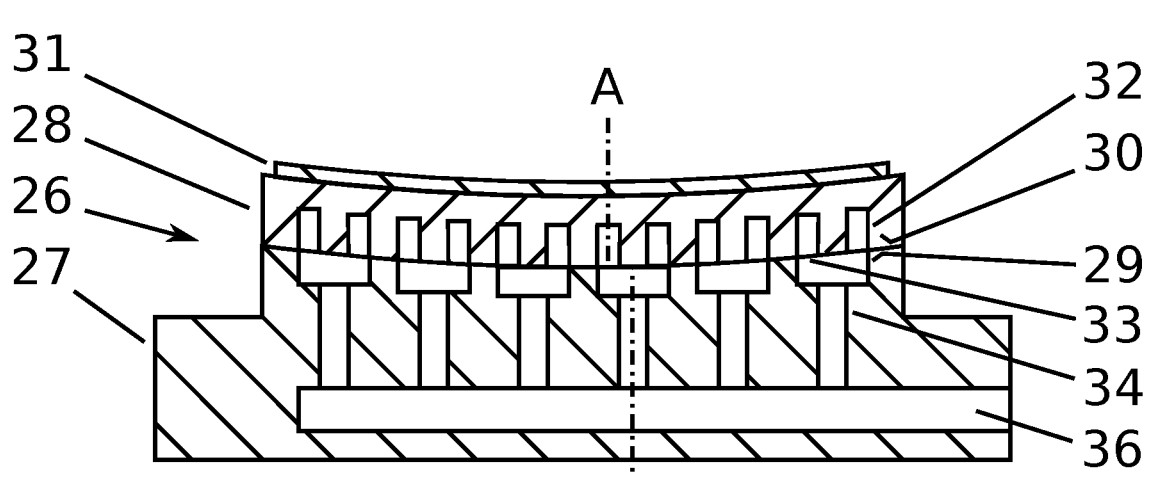
FIG. 3 shows an exemplary element of a mirror that has been produced by the method according to the disclosure in a schematic sectional illustration.
Figure 4:
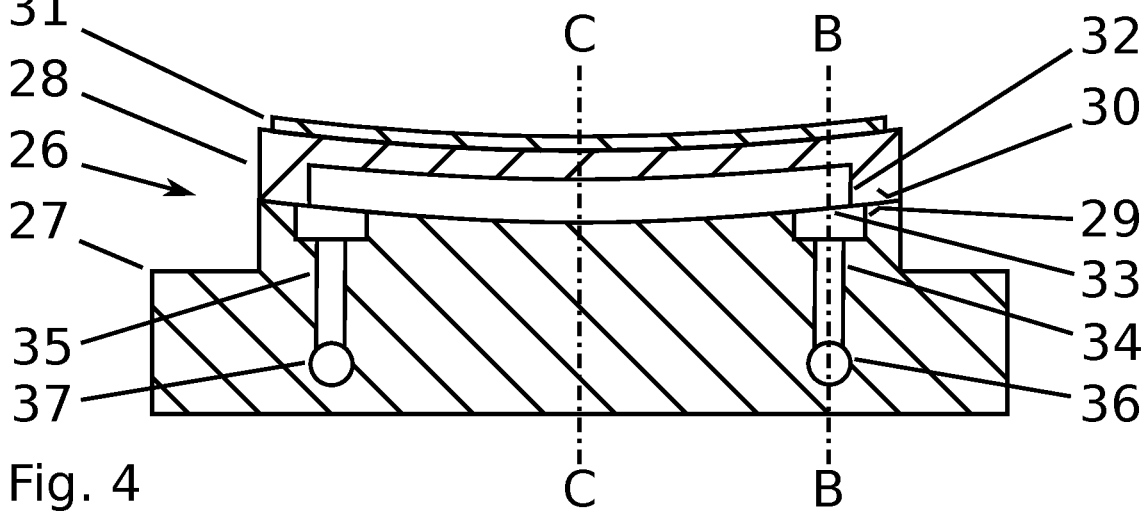
FIG. 4 shows the first exemplary embodiment of the mirror, shown in FIG. 3, in a further schematic sectional illustration.

FIG. 3 shows a schematic sectional illustration of an exemplary embodiment of a mirror 26 produced by the method according to the disclosure. FIG. 4 shows the same exemplary embodiment of the mirror 26 in a further schematic sectional illustration, in which the section is taken along a sectional line A-A depicted in FIG. 3. To be able to represent as many details of the mirror 26 as possible, the sectional line A-A has a lateral offset as it passes through the mirror 26. In FIG. 3, the section is guided along the sectional line B-B shown in FIG. 4. In FIGS. 3 and 4, the illustration of the mirror 26 and its component parts is not to scale and is highly abstract, in order to present the disclosure as clearly as possible. This also applies to all of the other figures.

In the case of one of the projection exposure apparatuses 1 shown in FIGS. 1 and 2, the mirror 26 can be used and has a lower part 27 and an upper part 28, which are in each case produced from quartz glass, Ti-doped quartz glass or a glass ceramic. The terms "lower part" and "upper part" have been chosen because the lower part 27 is generally formed much thicker than the upper part 28 and consequently carries the upper part 28, as it were. The terms do not, however, have anything to do with the orientation of the mirror 26 in relation to the direction of gravitational force in the mounted state of the mirror 26.

During the operation of the projection exposure apparatus 1, the upper part 28 may be arranged above or below or alongside the lower part 27 with respect to the direction of gravitational force, or assume some other relative position with respect to it. The lower part 27 is also referred to as the first mirror part 27 and the upper part 28 is also referred to as the second mirror part 28.

The lower part 27 and the upper part 28 are rigidly connected to one another in the region of a connecting surface 29 of the lower part 27 and a connecting surface 30 of the upper part 28 by means of the method according to the disclosure described in more detail below. In the exemplary embodiment shown, the connecting surface 29 of the lower part 27 is formed in a concavely curved manner. The curvature may be formed spherically, aspherically or according to a freeform surface. The connecting surface 30 of the upper part 28 is curved in a way complementary to the connecting surface 29 of the lower part 27, and accordingly has a convex curvature, which may be formed spherically, aspherically or according to a freeform surface. Consequently, the connecting surface 30 of the upper part 28 and the connecting surface 29 of the lower part 27 can rest against one another in close contact. As an alternative to a curved formation, the connecting surface 29 of the lower part 27 and the connecting surface 30 of the upper part 28 may also be formed in a planar manner.

On the side that is facing away from its connecting surface 29 and is shown at the bottom in FIG. 3, the lower part 27 is formed in a planar manner. On the side that is facing away from its connecting surface 30 and is shown at the top in FIG. 3, the upper part 28 is formed in a concavely curved manner and has a reflective optical surface 31 with an identical curvature. The curvature may be formed spherically, aspherically or according to a freeform surface and in particular correspond to the curvature of the connecting surface 30 of the upper part 28. Even when the connecting surfaces 29 and 30, the surface of the upper part 28 facing away from the connecting surface 30 and the optical surface 31 are formed in each case in a rotationally symmetrical manner, they respectively have in the sectional areas of FIGS. 3 and 4 a slightly different curvature, since these sectional areas are formed at different distances from the centres of the surfaces mentioned. However, the differences in distance in comparison with the absolute values of the radii of curvature are in each case very small, and so different curvatures are not perceptible in the illustrations of FIGS. 3 and 4.

As an alternative to this, it is also possible that the optical surface 31 is formed in a planar manner. This is the case in particular if the connecting surface 29 of the lower part 27 and the connecting surface 30 of the upper part 28 are formed in a planar manner.

The optical surface 31 is embodied as a coating applied to the upper part 28. The formation of the coating depends on the wavelength at which the optical surface 31 is intended to produce its reflective effect. In the case of a desired reflection in the DUV range, i.e. in the case of the mirror M of FIG. 2, the coating may be formed as an aluminium layer. If, on the other hand, a reflection in the EUV range is intended, as in the case for example of the mirror M3 of FIG. 1, the coating may be formed in particular from alternately successive layers of silicon and molybdenum and possibly one or more further layers of a different composition, which serve for example as protective layers.

The upper part 28 furthermore has a plurality of elongate cooling channels 32, which run parallel to one another and to the optical surface 31 and extend laterally in the region of the optical surface 31 and possibly somewhat beyond it. Accordingly, the cooling channels 32 in the case of the exemplary embodiment shown are formed in a curved manner. The cooling channels 32 extend up to the optical surface 31 to within a distance of about 1 to 6 mm and are formed as open towards the connecting surface 30 of the upper part 28. Accordingly, the cooling channels 32 have elongate cooling channel openings 33 in the region of the connecting surface 30 of the upper part 28. The transverse dimensions of the cooling channels 32 may be about 0.2 to 10 mm, wherein the depth of the cooling channels 32, i.e. the dimension approximately perpendicular to the connecting surface 30 of the upper part 28, is generally considerably greater than the width, i.e. the dimension approximately parallel to the connecting surface 30 of the upper part 28. For example, the depth of the cooling channels 32 may be more than twice the width of the cooling channels 32.

In the case of a formation of the connecting surface 30 of the upper part 28 that is not rotationally symmetrical, it may have different mean radii of curvature for different azimuth angles or, to put it another way, with respect to different directions. In this case, the direction in which the absolute value of the mean radius of curvature is the smallest can extend transversely, in particular perpendicular, to the longitudinal extents of the cooling channel openings 33. Mutually adjacent regions of the connecting surface 29 of the lower part 27 and the connecting surface 30 of the upper part 28 may in the unconnected state have slightly different mean radii of curvature, wherein the mean radius of curvature of the region of the convexly formed surface generally has a smaller absolute value than the mean radius of curvature of the corresponding region of the concavely formed surface. In the case of different mean radii of curvature in different directions, the following should apply for each direction separately.

The lower part 27 has a number of distributor channels 34 and collector channels 35, which extend from the connecting surface 29 of the lower part 27 in the direction of the side of the lower part 27 facing away from the connecting surface 29 into the lower part 27. Inside the lower part 27, the distributor channels 34 open out into a fluid distributor 36 and the collector channels 35 open out into a fluid collector 37. The distributor channels 34 and the collector channels 35 widen in each case in a step-shaped manner towards the connecting surface 29 of the lower part 27 and respectively overlap there with the opposite ends of two cooling channel openings 33. In other words, one distributor channel 34 respectively overlaps with one end of two cooling channel openings 33, and one collector channel 35 respectively overlaps with in each case the two other ends of the same two cooling channel openings 33. Accordingly, one distributor channel 34 is respectively fluidically connected at its one end to the fluid distributor 36 and at its other end to two cooling channels 32. By analogy, one collector channel 35 is respectively fluidically connected at its one end to the fluid collector 37 and at its other end to two cooling channels 32.

It is consequently possible to supply a fluid, for example water, to the cooling channels 32 through the fluid distributor 36 and to the distributor channels 34, wherein each distributor channel 34 respectively supplies two cooling channels 32 and the fluid distributor 36 supplies all of the distributor channels 34 with fluid. The fluid flows through the cooling channels 32 and then flows on via the collector channels 35 into the fluid collector 37, via which it can be removed. In this case, the fluid of every two cooling channels 32 flows respectively into one collector channel 35, and the fluid of all the collector channels 35 flows into the fluid collector 37. The supply of the fluid to the fluid distributor 36 and the removal of the fluid from the fluid collector 37 can take place with the aid of the cooling device 24, which for this purpose can be connected to the fluid distributor 36 and the fluid collector 37.

Adjusting the temperature of the supplied fluid to a temperature below the temperature of the upper part 28 can achieve the effect that the fluid extracts heat from the upper part 28 as it flows through the cooling channels 32. This extraction of heat is intended in particular to compensate for the input of heat due to the radiation that is incident on the optical surface 31 during the operation of the lithography system. Since the optical surface 31 does not completely reflect the incident radiation, part of the radiation is absorbed by the optical surface 31 and, depending on the formation of the optical surface 31, also absorbed by the upper part 28 and converted into heat. Since the optical surface 31 and the upper part 28 have a certain thermal conductivity, part of this heat is guided to the cooling channels 32 and can be taken up there by the fluid and transported away. In this way, the rise in temperature of the mirror 26 caused by the radiation can be limited and the deformation of the optical surface 31 caused by effects of thermal expansion can be reduced in comparison with an uncooled mirror 26. As a consequence, the imaging aberrations caused by the deformation are also reduced.

The formation and arrangement of the cooling channels 32, the distributor channels 34, the collector channels 35, the fluid distributor 36 and the fluid collector 37 may be modified in various ways. For example, the cooling channels 32 may be arranged in the lower part 27 and be formed as open towards the connecting surface 29 of the lower part 27, and so the cooling channels 32 have elongate cooling channel openings 33 in the region of the connecting surface 29 of the lower part 27. There may also be no need for the distributor channels 34 and the collector channels 35, and the fluid distributor 36 and the fluid collector 37 may be connected directly to the cooling channels 32 etc.

For producing the mirror 26, the lower part 27 and the upper part 28 are produced as separate parts and then connected to one another. The optical surface 31 is generally formed only after connecting the lower part 27 and the upper part 28 in order to achieve the highest possible precision, in particular with respect to its shape, and to avoid damage to the optical surface 31 during the connecting process. A material with a very low coefficient of thermal expansion is used for the manufacturing of the lower part 27 and the upper part 28. Suitable materials are for example quartz glass, quartz glass doped with titanium oxide or special glass ceramics. The lower part 27 and the upper part 28 may be cut out from a common material blank. However, there is also the possibility of using different material blanks for the lower part 27 and the upper part 28 if they do not differ too much from one another with respect to their material parameters.

For example, a quartz glass which is mixed with titanium oxide and has a zero crossing temperature averaged over the volume of the lower part 27 of between 22 and 25° C. may be used for the production of the lower part 27. The zero crossing temperature has been adjusted here to match the expected temperature of the lower part 27, taking into account the cooling of the mirror 26, during the operation of the lithography system. Depending on the method for producing the material used for the lower part 27, the increase in the coefficient of thermal expansion at 22° C. can be less than about 1.35 to 1.8 ppb/$K_2$.

The lower part 27 is cut out from the material blank and then worked by grinding and polishing. The connecting surface 29 of the lower part 27 here may in particular be brought into a form that corresponds approximately to the intended form of the optical surface 31, which is formed at a later time on the upper part 28. The shape deviation between the connecting surface 29 of the lower part 27 and the optical surface 31 is at most 3 mm, such as no more than 200 μm. If the connecting surface 29 of the lower part 27 has a circular boundary, its diameter is generally between 20 and 100 cm with a sag of up to 3% of the diameter. A spherical basic shape of the connecting surface 29 of the lower part 27 may be overlaid with any desired function, and so a freeform surface can be obtained.

With respect to a wavelength λ of 633 nm used for the measurement, the polishing of the connecting surface 29 of the lower part 27 may take place with a deviation from a specified shape (figure) of less than λ/2, such as less than λ/10. Furthermore, a roughness of less than 5 nm, such as less than 1 nm, may be achieved in this case. The term "roughness" in this case subsumes the randomly distributed deviations from a smooth surface. Shape or figure deviations are considered to comprise both longwave deviations from the specified shape and shortwave, and more point-like, not randomly distributed deviations. The longwave shape deviation may also be somewhat greater than the aforementioned values of λ/2 and λ/10. With respect to the shortwave deviation, the values mentioned are however maintained wherever possible. For example, deviations with spatial frequencies of several cm do not have such a disruptive effect. Deviations with spatial frequencies below 100 μm are generally much more disruptive. If the final connection of the lower part 27 and the upper part 28 as part of a bonding process takes place at very high temperatures, in particular at temperatures above 1000° C., the desired properties with respect to roughness and shape deviations can be relaxed somewhat and the connecting surface 29 of the lower part 27 can alternatively be worked by lapping. Depending on the material of the lower part 27, the desired temperatures can also be 1200° C. or more.

In order to avoid drying in of remains of grinding and polishing agents, the lower part 27 is rinsed off directly after the grinding and after the polishing. Furthermore, mechanical wet cleaning may be carried out. The surface of the lower part 27 may be additionally cleaned with solvents, organic and inorganic cleaning agents or by means of a plasma treatment etc.

When working the lower part 27, it is generally desirable to ensure that damage at depth is avoided, because small amounts of water, other process agents such as for example polishing agents or contaminants, can be left behind in micro cracks and they may evaporate away and lead to local blistering when the lower part 27 is heated up. To avoid or eliminate possible damage at depth, dry and/or wet etching steps or other suitable optical working steps may be used. Furthermore, graduated grinding steps may be used, or contactless removal may be performed, for example by etching with oxygen plasma, which may be followed by a polishing step. Freedom from damage at depth is demonstrated for example by briefly etching with fluoric acid and this not leading to local etch pits. A fluoric acid bath is suitable at the same time as a cleaning step for removing hydrocarbons.

After the grinding and polishing or lapping, if applicable the distributor channels 34 and the collector channels 35 as well as the fluid distributor 36 and the fluid collector 37 are formed in the lower part 27. Depending on the formation of the lower part 27, the cooling channels 32 may be formed in the lower part 27. The distributor channels 34 and the collector channels 35 as well as the fluid distributor 36 and the fluid collector 37 generally have transverse dimensions, i.e. dimensions transverse to the direction of flow of the fluid, that are much greater than the corresponding dimensions of the cooling channels 32.

The respective channels may be formed by milling, grinding, drilling, laser ablation, ultrasound ablation or etching or a combination of these methods. As a last method step, etching with fluoric acid may be provided in each case, in order to avoid later crack propagation and to form a surface in the channels that is only slightly roughened in a way conducive to flow.

In order to protect the already worked, in particular polished, surface of the lower part 27 from breakouts at the edges, for example at the peripheries of the cooling channel openings 33, and from similar damage, a protective resist may be applied to the surface of the lower part 27 before the forming of the channels. Any breakouts at the edges that occur in spite of this precautionary measure may be smoothed out locally or eliminated by a bevel running for example around the cooling channel openings 33. However, this bevel can be disadvantageous in terms of flow and in terms of strength because of the notch effect and should be avoided as far as possible.

As an alternative to the procedure described above, there is the possibility of first forming the channels in the lower part 27 and only then working the surface of the lower part 27 by grinding, lapping and/or polishing. This however results in a certain rounding at the edges of the cooling channel openings 33 or other openings, because for example the polishing discs have a finite stiffness and bulge into the cooling channel openings 33 or other openings. This rounding at the edges can be counteracted by inserting or cementing in placeholders of the same material as the lower part 27 into the cooling channel openings 33 or other openings. The placeholders are ground away and polished together with the connecting surface 29 of the lower part 27 and reduce the widths of the gaps caused by the cooling channel openings 33 or other openings. The gaps remaining between the placeholders and the surrounding material of the lower part 27 may also be grouted with a glass- or ceramic-powder-filled putty, and so during the polishing there is at most slight bulging, and accordingly very little rounding at the edges. Alternatively, local reworking may take place by means of robot polishing or ion beam polishing in order to minimize the rounding at the edges. After the working of the surface of the lower part 27, the placeholders, and if applicable the grouting material, are removed again.

In order to avoid, or at least reduce, rounding at the edges, ablating or etching methods may be used as an alternative to mechanical surface working. If, within these methods, a resist mask is applied to the regions that are not to be worked, underetching may occur in the peripheral regions of the resist mask. The adverse effects of this underetching can be counteracted by suitable mechanical, laser-ablative or etching reworking.

A material with identical or similar properties as described for the lower part 27 may be used for the production of the upper part 28. The material properties of the upper part 28 may only deviate within specified limits from the material properties of the lower part 27. After the cutting-out of the upper part 28 from the material blank, the surface of the upper part 28, in particular the connecting surface 30, may be worked in an analogous way to that described for the lower part 27, and analogous desired properties with respect to shape deviation and roughness have to be met. As has already been described for the lower part 27, the desired properties with respect to roughness and shape deviations can be relaxed somewhat and the connecting surface 30 of the upper part 28 can be worked by lapping if the final connection of the lower part 27 and the upper part 28 takes place as part of a bonding process at very high temperatures, in particular temperatures above 1000° C. or above 1200° C. Relaxing the desired properties is possible also if the upper part 28 is comparatively thin and also for longwave shape deviations.

Depending on the variant of the embodiment, the upper part 28 may have cooling channels 32 and/or other channels, such as for example distributor channels 34 and collector channels 35. All of these channels can be produced in an analogous way to that described for the lower part 27 and analogous measures can be used for reducing the rounding at the edges etc.

The upper part 28 generally has a thickness of between 10 and 40 mm, but under certain preconditions may also have a smaller thickness. Depending on the thickness, it may be desirable to cement or optically contact bond the upper part 28 onto a glass substrate as a carrier material for processing, in order to achieve a stiffness sufficient for precise working.

Tools that have the same or very similar nominal curvature as the tools for working the connecting surface 29 of the lower part 27 may be used for the working of the connecting surface 30 of the upper part 28 by grinding, lapping and/or polishing. Optionally, a further step may be provided after that, in which the actual shapes of the connecting surface 29 of the lower part 27 and the connecting surface 30 of the upper part 28 are measured and the connecting surface 30 of the upper part 28 is locally adapted to the connecting surface 29 of the lower part 27 by robot polishing, plasma etching, ion beam ablation or compacting high-energy irradiation.

In the case of embodiments of the mirror 26 in which the connecting surface 29 of the lower part 27 is substantially plane or has a very small curvature, and so the absolute value of the mean radius of curvature for at least one azimuth angle is greater than 10 m, there is the possibility of using a comparatively thin upper part 28, which has a thickness of 0.5 to 10 mm, and of forming the connecting surface 30 of the upper part 28 in a planar manner. In this case, the upper part 28 may be deformed as it is being connected to the lower part 27, and as a result the connecting surface 30 of the upper part 28 may be adapted to the shape of the connecting surface 29 of the lower part 27. For the working involved before the connection, the upper part 28 may be cemented onto a sufficiently stiff carrier material or be optically contact bonded onto the carrier material.

As an alternative to the use of an upper part 28 cut out from a material blank, a thin upper part 28 of titanium-doped quartz glass may also be produced by flowing out, for example on molten metal (float glass), pouring over a long break-away edge, pressing and sintering of glass soot or indirectly by way of a grey body. These methods can mean that the upper part 28 is produced from a sheet a few millimetres thick, in which good homogeneity with respect to the material parameters can be achieved, and that it may be possible to dispense with mechanical working. To be able to achieve similar thermal expansion behaviour as in the case of the lower part 27 with an upper part 28 from such a sheet, the OH content of the sheet should deviate by at most 5% and the titanium content of the sheet should deviate by at most 0.05% from the respective content of the lower part 27. In the case of very thin sheets from which upper parts 28 with thicknesses of less than 2 mm are produced, these properties can be relaxed a little further.

When the working of the lower part 27 and the upper part 28 has finished, they can be connected to one another in the region of their connecting surfaces 29, 30. The connection is performed in two steps: In a first step, the upper part 28 is optically contact bonded onto the lower part 27, i.e. is brought up so close to the lower part 27 that it becomes attached to the lower part 27 as a result of the van der Waals forces between the atoms of the lower part 27 and the atoms of the upper part 28. In a second step, the connection between the upper part and the lower part 27 is strengthened by means of a bonding process, by which covalent bonds are formed between the atoms of the lower part 27 and the atoms of the upper part 28, and so the upper part 28 and the lower part 27 are permanently connected very strongly to one another.

Before the optical contact bonding, the lower part 27 and the upper part 28 are cleaned, activated and dried, in particular in the region of their connecting surfaces 29, 30. For example, the connecting surface 29 of the lower part 27 and the connecting surface 30 of the upper part 28 may be simultaneously cleaned, ablated and activated by etching, for example with fluoric acid, by sputtering or by plasma treatment, in particular with hydrogen or oxygen plasma.

For optical contact bonding onto the lower part 27, the connecting surface 30 of the upper part 28 is brought up so close to the connecting surface 29 of the lower part 27 that a strong attraction occurs as a result of the van der Waals forces between the atoms near the surface of the upper part 28 and the atoms near the surface of the lower part 27 which ultimately connects the upper part 28 and the lower part 27 to one another. Since the van der Waals forces only act over very short distances, it is generally desirable to bring the connecting surface 30 of the upper part 28 and the connecting surface 29 of the lower part 27 very close together. Within a relatively large surface area this is possible only if the connecting surface 30 of the upper part 28 and the connecting surface 29 of the lower part 27 are very smooth, have almost exactly the same shape and are largely free from contaminants. It is also of great importance for bringing the connecting surface 30 of the upper part 28 and the connecting surface 29 of the lower part 27 sufficiently close together to prevent as far as possible inclusions of air or other gases between the connecting surfaces 30, 29. These gas inclusions may also have adverse effects during the later use of the mirror 26.

It is for this reason that the above-described preparations are made and the measures described in more detail below are taken up, in order to allow the connecting surfaces 29, to rest tightly against one another and in order to largely prevent gas inclusions, and thus obtain optical contact bonding that is as optimal as possible. One of these measures will be explained in more detail on the basis of FIG. 5.

Figure 5:
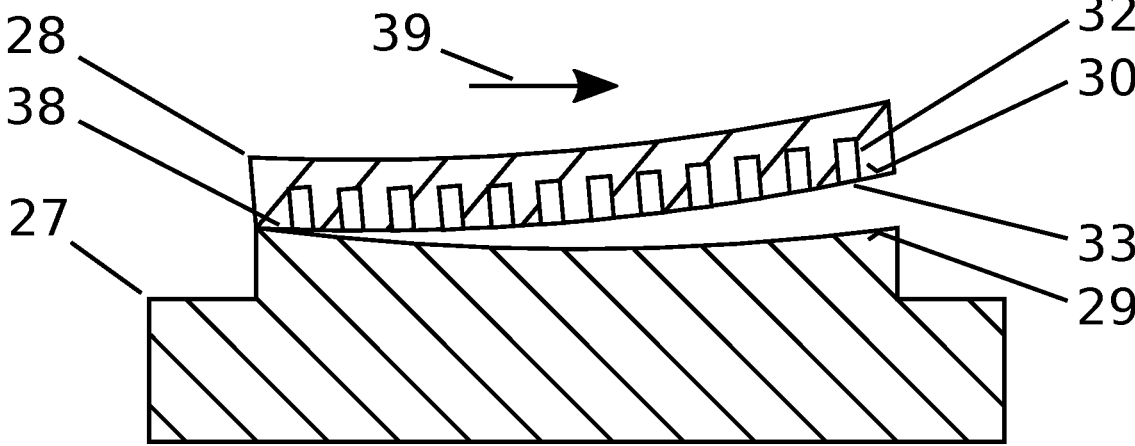
FIG. 5 shows a snapshot during the optical contact bonding of the upper part onto the lower part in a schematic sectional illustration.

FIG. 5 shows a snapshot during the optical contact bonding of the upper part 28 onto the lower part 27 in a schematic sectional illustration. The section is implemented along a sectional line C-C, which is plotted in FIG. 4, and consequently perpendicular to the longitudinal extents of the cooling channels 32.

In the case of the exemplary embodiment shown, the connecting surface 29 of the lower part 27 and the connecting surface 30 of the upper part 28 have at least approximately complementary curvatures. As can be seen from FIG. 5, the connecting surface 30 of the upper part 28 is not brought up to the connecting surface 29 of the lower part 27 in parallel alignment over the full surface area, but instead the connecting surfaces 29, 30 form an angle with one another when they are brought together and initially only meet one another in the region of their peripheral surfaces shown on the left in FIG. 5. In FIG. 5, the angle is exaggerated in order that the effect can be seen. As they are brought together, initially there is only contact between the upper part 28 and the lower part 27 in a small region of the connecting surfaces 29, 30, and so initially only a comparatively small contact surface 28 is formed between the upper part 28 and the lower part 27. Van der Waals forces produce their attractive effect within the contact surface 38, and so optical contact bonding of the connecting surface 30 of the upper part 28 onto the connecting surface 29 of the lower part 27 occurs in the region of the contact surface 38.

The upper part 28 is then successively pivoted further toward the lower part 27 and thereby brought ever closer to it, and consequently the contact surface 38 increases in size. Accordingly, the surface area within which the upper part 28 is optically contact bonded onto the lower part 27 also increases in size. The linearly formed transition between the optically contact bonded region of the connecting surfaces 29, 30 and the region of the connecting surfaces 29, 30 not optically contact bonded is referred to hereafter as the optical contact bond front. In the illustration of FIG. 5, the optical contact bond front runs perpendicularly in relation to the plane of the drawing and approximately parallel to the longitudinal extents of the cooling channels 32. This applies at least in the region where the optical contact bond front passes through the plane of the drawing. The optical contact bond front may be formed as a straight line or slightly curved and, as the upper part 28 is increasingly brought up to the lower part 27, moves from the left to the right, i.e. the approach of the upper part 28 to the lower part 27 progresses successively from the left to the right. The progressive approach is also referred to hereafter as "rolling", and in the illustration of FIG. 5 the upper part 28 is thus rolled up to the lower part 27 from the left to the right. The direction of the rolling movement is illustrated in FIG. 5 by an arrow and is referred to hereafter as the rolling direction 39.

The successive optical contact bonding with a steadily migrating, linear optical contact bond front has the effect that the gas is successively displaced out of the intermediate space between the connecting surface 30 of the upper part 28 and the connecting surface 29 of the lower part 27, and as a result the risk of gas inclusions is reduced considerably. The optical contact bonding operation is ended when the connecting surface 30 of the upper part 28 has been optically contact bonded onto the connecting surface 29 of the lower part 27 over the full surface area.

In the case of exemplary embodiments in which the connecting surface 30 of the upper part 28 and the connecting surface 29 of the lower part 27 are not formed in a rotationally symmetrical manner, the connecting surface 30 of the upper part 28 can be rolled up to the connecting surface 29 of the lower part 27 parallel to a direction in which the connecting surfaces 29, 30 have the smallest absolute value of the mean radius of curvature.

The escape of the gas from the intermediate space between the connecting surface 30 of the upper part 28 and the connecting surface 29 of the lower part 27 can be made even easier to some extent by the connecting surface 30 of the upper part 28 and the connecting surface 29 of the lower part 27 not having exactly the same curvature. This will be explained on the basis of FIG. 6.

As can be seen from FIG. 5, the rolling direction 39 runs transversely, in particular perpendicularly, to the longitudinal extent of the cooling channel openings 33 and the cooling channels 32. Since the thickness of the upper part 28 is reduced considerably in the region of the cooling channels 32, these regions act in a way similar to joints and make it easier for the upper part 28 to bend in these regions. This has the consequence that only a comparatively small force is involved to keep the upper part 28 outside the contact surface 38 temporarily at a sufficiently great distance from the lower part 27 to prevent optical contact bonding from occurring there and to make the connecting surface of the upper part 28 continuously approach the connecting surface 29 of the lower part 27. Furthermore, in the region of the contact surface 38, better engagement of the connecting surface 30 of the upper part 28 in close contact with the connecting surface 29 of the lower part 27 is achieved and very reliable optical contact bonding is made possible as a result. This will be explained in greater detail on the basis of FIG. 7.

Local stresses may be formed during optical contact bonding on account of the transversely extending cooling channels 32. However, these may be kept low by virtue of the optical contact bonding being performed by means of a robot and a particularly uniform optical contact bonding speed. There is also the possibility of reducing local stresses by virtue of the bonding process being performed at very high temperatures, in particular at temperatures between the anneal point and the softening point of the material of the lower part 27 and the upper part 28. By way of example, temperatures between 1200° C. and 1400° C. may be provided.

Figure 6:
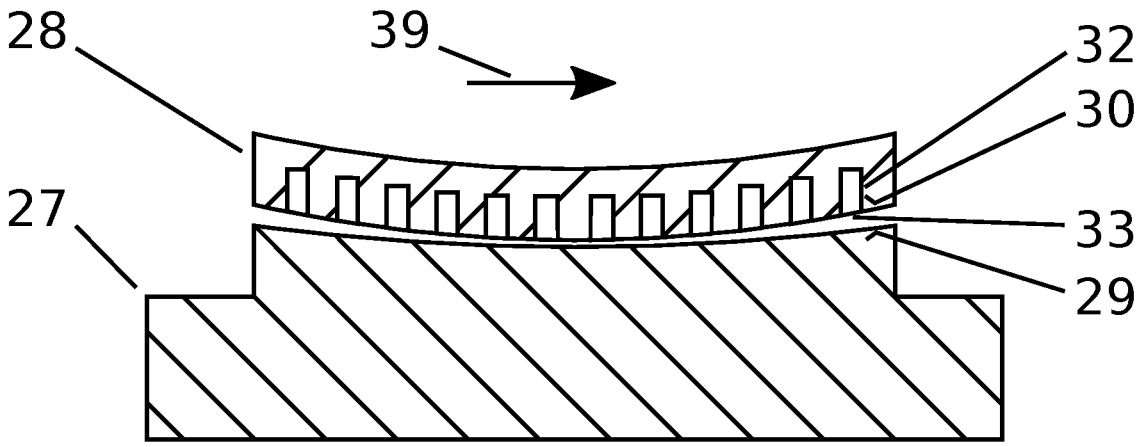
FIG. 6 shows a schematic sectional illustration of an upper part and a lower part.

FIG. 6 shows a schematic sectional illustration of an upper part 28 and a lower part 27. The section has been chosen in a manner analogous to FIG. 5. Accordingly, the section is implemented along the sectional line C-C plotted in FIG. 4 and consequently perpendicular to the longitudinal extents of the cooling channels 32. The upper part 28 is shown with a very small distance from and in parallel orientation with respect to the lower part 27. However, this does not represent a snapshot during the optical contact bonding but serves for illustrating the geometry of the connecting surface 30 of the upper part 28 and the connecting surface 29 of the lower part 27. Nevertheless, the upper part 28 and the lower part 27 are shown in the relative azimuthal rotational orientation with respect to one another which they adopt during the optical contact bonding, and the sectional plane of the illustration extends parallel to the rolling direction 39 during the optical contact bonding.

It is apparent from FIG. 6 that the connecting surface 29 of the lower part 27 is formed so as to be curved, in particular concavely curved. The connecting surface 30 of the upper part 28 is the opposite of the connecting surface 29 of the lower part 27 and thus formed so as to be convexly curved. It is further apparent from FIG. 6 that the connecting surface 30 of the upper part 28 has in the sectional plane of FIG. 6 and thus in a direction parallel to the rolling direction 39 a more pronounced curvature than the connecting surface 29 of the lower part 27. In other words, the connecting surface 30 of the upper part 28 has, with respect to the direction, a mean radius of curvature with a smaller absolute value than the connecting surface 29 of the lower part 27. The difference in curvatures is exaggerated in FIG. 6, because it would not be discernible otherwise.

The different curvatures of the connecting surface 30 of the upper part 28 and the connecting surface 29 of the lower part 27 have the result that, when the upper part 28 is rolled up to the lower part 27, a wedge-shaped gap remains continuously between the connecting surface 30 of the upper part 28 and the connecting surface 29 of the lower part 27 beyond the optical contact bond front, via which gap the gas between the connecting surface 30 of the upper part 28 and the connecting surface 29 of the lower part 27 can escape. Moreover, the wedge-shaped gap causes the distance between the connecting surface 30 of the upper part 28 and the connecting surface 29 of the lower part 27 to increase with increasing distance from the contact surface 38, even if the upper part 38 is not actively bent away from the lower part 27. As a rule, the upper part 28 is nevertheless bent away from the lower part 27 during the optical contact bonding process in order to attain a sufficient distance between the connecting surface 30 of the upper part 28 and the connecting surface 29 of the lower part 27, which distance is then successively reduced in the region of the optical contact bond front. The described set-up is present whenever it is that one of the connecting surfaces 29, 30 that is convexly curved that has a mean radius of curvature with a smaller absolute value than that one of the connecting surfaces 29, 30 that is concavely curved.

Figure 7:
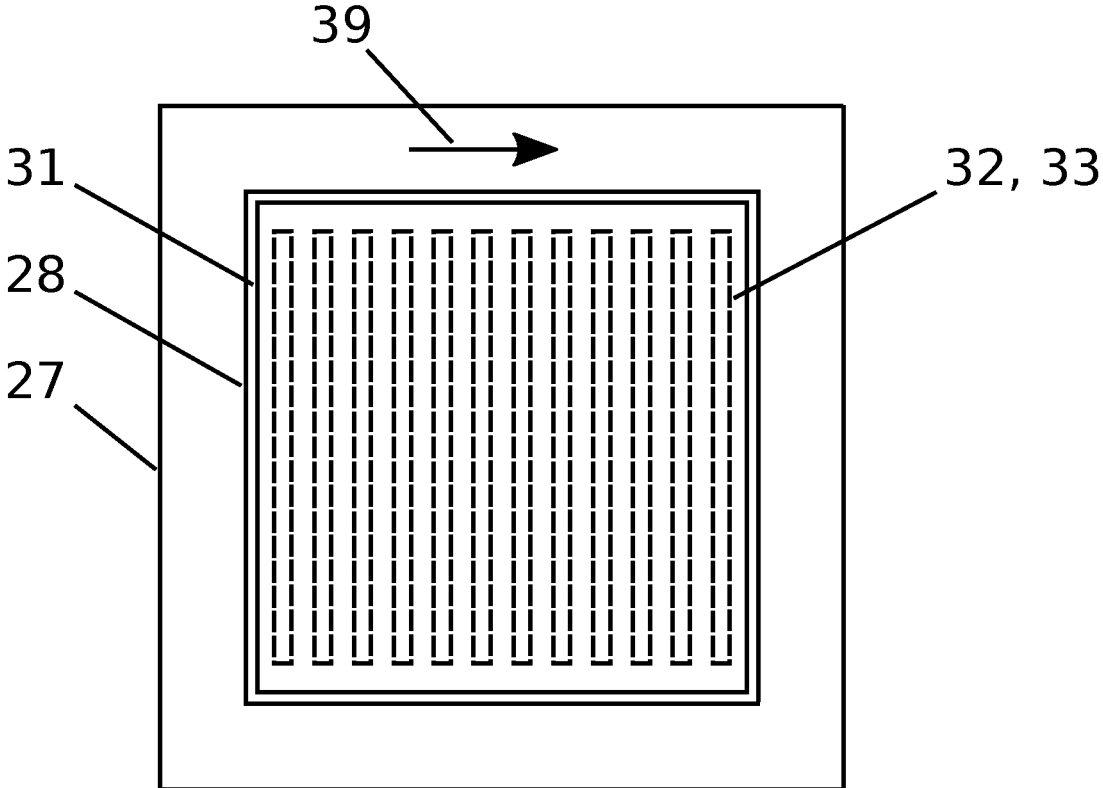
FIG. 7 shows a snapshot during the optical contact bonding of the upper part onto the lower part in a schematic top view.

FIG. 7 shows a snapshot during the optical contact bonding of the upper part 28 onto the lower part 27 in a schematic top view. In a different situation than in FIG. 5, the position of the optical surface 31 is drawn in FIG. 7, although the optical surface 31 is generally formed only after the optical contact bonding. The formation of the lower part 27, the upper part 28 and the optical surface 31, which formation is rectangular viewed from the top, was chosen by way of example because it is possible in this way to very illustratively show large-area coverage of the connecting surface 30 of the upper part 28 with cooling channels 32, that is to say a distribution of the cooling channels 32 over nearly the entire lateral region of the connecting surface 30 of the upper part 28. The connecting surface 30 of the upper part 28 is not directly visible in FIG. 7. However, FIG. 7 shows the upper part 28, which carries the connecting surface 30 and whose outer contour in the illustrated exemplary embodiment matches the boundary of the connecting surface 30. The actual shapes of the lower part 27, the upper part 28 and the optical surface 31 can deviate in each case from the illustration of FIG. 7 and be dependent for example on the optical and mechanical situation, the available installation space and so on.

In the illustration of FIG. 7, the rolling direction 39 runs from the left to the right. In FIG. 7, the periphery of the connecting surface 30 of the upper part 28 illustrated on the left is initially brought up to the periphery of the connecting surface 29 of the lower part 27 illustrated on the left in FIG. 7 until the connecting surface 30 of the upper part 28 and the connecting surface 29 of the lower part 27 come into contact. Then, the connecting surface 30 of the upper part 28 is rolled up to the connecting surface 29 of the lower part 27 from the left to the right and is consequently successively optically contact bonded thereon, that is to say the optical contact bond front extends from the left and right in the illustration of FIG. 7. As is furthermore apparent from FIG. 7, the cooling channels 32, which are arranged in the upper part 28 and are formed as open towards the connecting surface 30 of the upper part 28, and in particular the longitudinal extents of the cooling channel openings 33 extend perpendicular to the rolling direction 39.

Optically contact bonding the upper part 28 onto the lower part 27 with a rolling direction 39 perpendicular to the longitudinal extent of the cooling channel openings 33 makes it easier to rest the connecting surface 30 of the upper part 28 on the connecting surface 29 of the lower part 27 in controlled fashion. It is possible to equally ensure that a close and full-area contact is formed between the connecting surface 30 of the upper part 28 and the connecting surface 29 of the lower part 27 in the region of the contact surface 38 and that a sufficiently large distance between the connecting surfaces 29, 30 is maintained outside of the region of the contact surface 38. This effect is particularly pronounced if the cooling channels 32, as in the case of the exemplary embodiment of FIG. 7, extend over nearly the entire lateral region of the connecting surface 30 of the upper part 28, since a particularly good deformability of the upper part 28 is achieved in that case. Moreover, the clear distance between the cooling channel openings 33 being no more than 15 mm, such as no more than 5 mm, can be desirable for resting the connecting surface 30 of the upper part 28 on the connecting surface 29 of the lower part 27.

Generally, the cooling channels 32 and the cooling channel openings 33 are arranged only within a region in the upper part 28 or lower part 27 that is arranged laterally within the optical surface 31 in the finished mirror 26, wherein a slight overrun, that is to say a slight extent also outside this region, is possible. Thus, there may be areas on the connecting surface 30 of the upper part 28 laterally outside of the region of the optical surface 31 in which no cooling channels 32 are arranged and in which the deformability of the upper part 28 is consequently lower than in the region with the cooling channels 32. This problem is hardly noticeable in the embodiment illustrated in FIG. 7 since the optical surface 31, and hence also the cooling channels 32, extend close to the outer contour of the upper part 28. However, there are also embodiments of the mirror 26 where the lateral dimensions of the optical surface 31 are significantly smaller than the lateral dimensions of the upper part 28 and the cooling channels 32 do not extend close to the outer contour of the upper part 28. However, in this case, too, there is the possibility of attaining a similarly high deformability of the upper part 28 laterally outside of the region of the optical surface 31 as laterally within the region of the optical surface 31. This will be explained in greater detail on the basis of FIG. 8.

Figure 8:
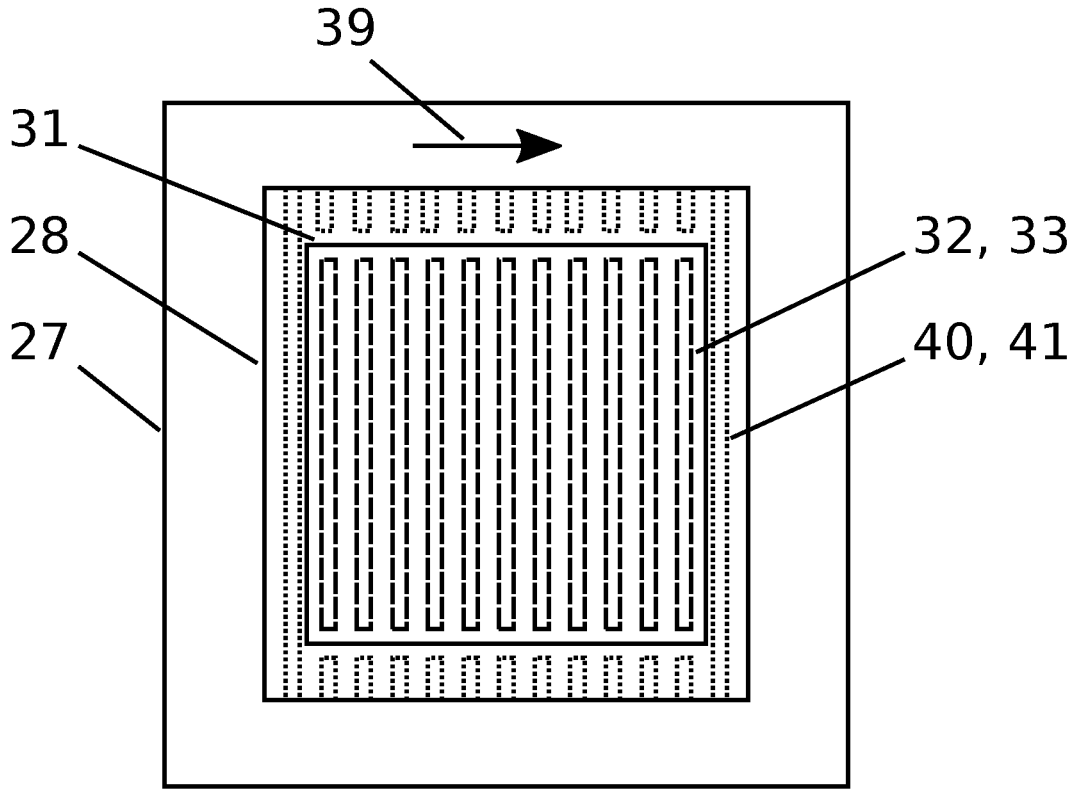
FIG. 8 shows a further snapshot during the optical contact bonding of the upper part onto the lower part in an illustration corresponding to FIG. 7.

FIG. 8 shows a further snapshot during the optical contact bonding of the upper part 28 onto the lower part 27 in an illustration corresponding to FIG. 7. For easier orientation, the outlines of the optical surface 31 are drawn, even though the optical surface 31 is not formed until a later point in time. The snapshot according to FIG. 8 again shows an upper part 28 with a rectangular outer contour and differs from the snapshot according to FIG. 7 in that the optical surface 31 has much smaller lateral dimensions than the upper part 28 and in that the upper part 28 has auxiliary channels 40 in addition to the cooling channels 32.

Since the cooling channels 32 extend only within the lateral region of the optical surface 31, a region without cooling channels 32 and without cooling channel openings 33 remains in the intermediate space between the optical surface 31 and the outer contour of the upper part 28. The auxiliary channels 40 are arranged in this region. The auxiliary channels 40 are arranged in the upper part 28 completely or mostly laterally outside the region intended for the optical surface 31 and are open towards the connecting surface 30 of the upper part 28, with the result that elongate auxiliary channel openings 41 are formed in the connecting surface 30. The direction of the longitudinal extent of the auxiliary channels 40 and the auxiliary channel openings 41 corresponds to the direction of the longitudinal extent of the cooling channels 32 and the cooling channel openings 33 and extends perpendicular to the rolling direction 39. The clear spacings between the auxiliary channels 40 are at most as large as the clear spacings between the cooling channels 32. During optical contact bonding, the auxiliary channels 40 fulfil the same function as the cooling channels 32, specifically increasing the deformability of the upper part 28, to simplify the connecting surface 30 of the upper part 28 resting on the connecting surface 29 of the lower part 27. Accordingly, if possible all the regions of the connecting surface 30 of the upper part 28 that have no cooling channels 32 are provided with auxiliary channels 40.

The auxiliary channels 40 can be produced in a similar manner as the cooling channels 32 and are formed separately from the cooling channels 32 and are not fluidically connected to the cooling channels 32. The auxiliary channels 40 are fluidically connected to the environment. This can be achieved for example by the auxiliary channels 40 being formed as open towards the side surfaces of the upper part 28 or being vented via holes in the lower part 27 that open out into the connecting surface 29 of the lower part 27 and extend completely through the lower part 27. Before the mirror 26 is mounted in a lithography system, the auxiliary channels 40 are thoroughly cleaned, for example by etching and multiple flushing operations.

As an alternative to the formation of a fluidic connection with the environment, it is also possible to close up the auxiliary channels 40. In a variant, the auxiliary channels 40 are closed up by a flexible membrane, which allows a certain pressure equalization with the environment. In a further variant, the auxiliary channels 40 are filled with a fluid and closed up in a manner such that it is possible to establish a desired fluid pressure in the auxiliary channels 40 and in this way implement a pressure-controlled manipulator. It is likewise possible for the fluid to be used for additional cooling or heating of the mirror 26. It is additionally possible to introduce a heating wire into the auxiliary channels 40 for heating the mirror 26.

The optical contact bonding operation is started by bringing the connecting surface 30 of the upper part 28 and the connecting surface 29 of the lower part 27 together in the vicinity of their peripheral surfaces shown on the left in FIG. 8 and is continued by a rolling movement proceeding from the left to the right until the connecting surface 30 of the upper part 28 is completely optically contact bonded onto the connecting surface 29 of the lower part 27. In this case, the cooling channels 32 and the auxiliary channel openings 41 promote the deformability of the upper part 28 in the entire region of its connecting surface 30. For the rest, what was stated with respect to FIG. 7 applies analogously.

Figure 9:
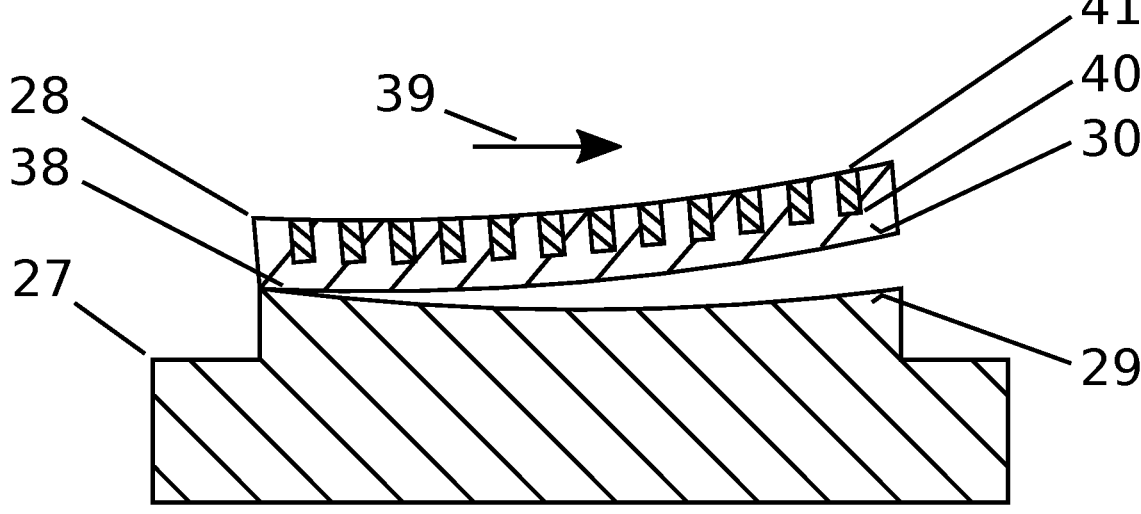
FIG. 9 shows a further snapshot during the optical contact bonding of the upper part onto the lower part in an illustration corresponding to FIG. 5.

FIG. 9 shows a further snapshot during the optical contact bonding of the upper part 28 onto the lower part 27 in an illustration corresponding to FIG. 5. The snapshot according to FIG. 9 differs from the snapshot according to FIG. 5 in a different configuration of the upper part 28. In contrast to the upper part 28 according to FIG. 5, the upper part 28 illustrated in FIG. 9 has no cooling channels 32. Instead, the upper part 28 according to FIG. 9 has a plurality of auxiliary channels 40 that extend parallel to one another. The auxiliary channels 40 have an open form towards the side of the upper part 28 facing away from the connecting surface 30, that is to say towards the upper side of the upper part 28 in accordance with FIG. 9, and have auxiliary channel openings 41 there. The auxiliary channels 40 may be produced in a manner analogous to what was already described for the cooling channels 32 and the auxiliary channels are filled with an elastic material to simplify the handling of the upper part 28 during the optical contact bonding to the lower part 27.

A similarly good deformability during optical contact bonding can be obtained with the auxiliary channels 40 as was obtained with the cooling channels 32 of the embodiments already described, and optical contact bonding is implemented in a manner analogous to what was already described. Accordingly, the connecting surface 30 on the side of the upper part 28 illustrated to the left in FIG. 9 is brought towards the connecting surface 29 of the lower part 27 and the contact surface 38 is formed as a result. By continuing to bring the upper part 28 close to the lower part 27, the contact surface 38 is continuously enlarged until the whole area of the connecting surface 30 of the upper part 28 has been optically contact bonded onto the connecting surface 29 of the lower part 27. To simplify the connecting surface 30 of the upper part 28 resting on the connecting surface 29 of the lower part 27, the rolling direction 39 extends transversely, in particular perpendicular, to the longitudinal extent of the auxiliary channels 40 during optical contact bonding. For the purposes of a best-possible deformability of the upper part 28, provision can be made for the auxiliary channels 40 to extend over the entire lateral extent of the upper part 28 in the longitudinal direction, that is to say for the auxiliary channels to reach the outer contour of the upper part. Consequently, the auxiliary channels 40 are not restricted to the lateral region on which the optical surface 31 is formed at a later time.

After optically contact bonding the upper part 28 onto the lower part 27, the elastic material is removed from the auxiliary channels 40 before the lower part 27 and the upper part 28 are subjected to heat treatment within the scope of the further connecting process. Once the connection between the lower part 27 and the upper part 28 has been fully formed, the webs adjacent to the auxiliary channels 40 are removed by milling and/or grinding and polishing steps are carried out in order to create a suitable substrate for forming the optical surface 31.

The described procedure may also be performed using an upper part 28 which has cooling channels 32 in addition to the auxiliary channels 40. The cooling channels 32 may be formed open towards the connecting surface 30 of the upper part 28 in the manner already described. If the rolling direction 39 when optically contact bonding the upper part 28 onto the lower part 27 is chosen to be parallel to the cooling channels 32, then the region between the connecting surfaces 29, 30 can be vented more easily during the optical contact bonding since the gas can then escape this region via the cooling channels 32. The auxiliary channels 40 extend perpendicular to the rolling direction 29 and therefore also perpendicular to the cooling channels 32.

Figure 10:
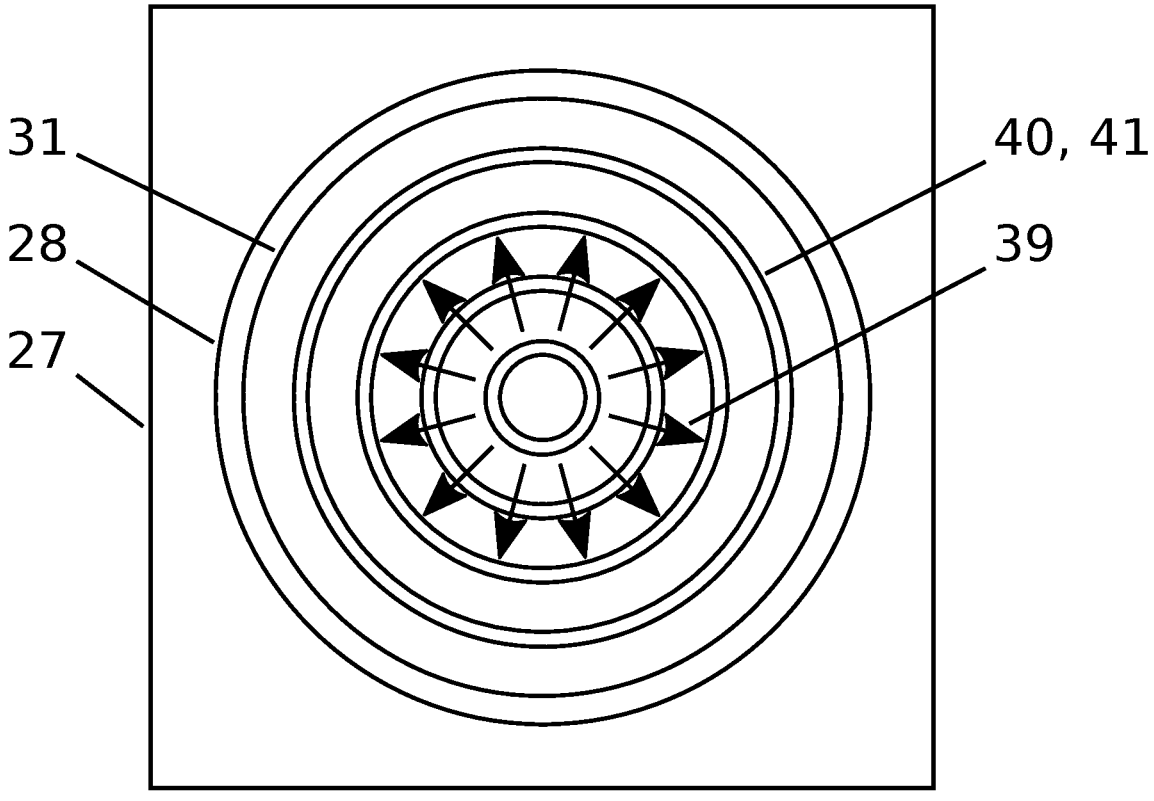
FIG. 10 shows a further snapshot during the optical contact bonding of the upper part onto the lower part in an illustration corresponding to FIG. 7.

FIG. 10 shows a further snapshot during the optical contact bonding of the upper part 28 onto the lower part 27 in an illustration corresponding to FIG. 7. The snapshot according to FIG. 10 differs from the snapshot according to FIG. 7 in a different configuration of the upper part 28 and of the lower part 27. The upper part 28 illustrated in FIG. 7 has a shape that is rectangular viewed from the top and has linearly formed and mutually parallel cooling channels 32 and cooling channel openings 33. In the top view there, the connecting surface 29 of the lower part 27 likewise has a rectangular form and is exactly concealed by the upper part 28. By contrast, the upper part 28 illustrated in FIG. 10 has a circular outer contour in the top view and the connecting surface 29 of the lower part 27 is also circular in the top view, but once again concealed by the upper part 28. A further difference is that the upper part 28 according to FIG. 10 does not have cooling channels 32, but auxiliary channels 40. For easier orientation, the outlines of the optical surface 31 are once again drawn in FIG. 10, even though the optical surface 31 is not formed until a later point in time.

In a manner analogous to FIG. 9, the auxiliary channels 40 also have an open form towards the side of the upper part 28 facing away from the connecting surface 30 in the snapshot of FIG. 10, that is to say towards the upper side of the upper part 28 in accordance with FIG. 10, and have auxiliary channel openings 41 there. The auxiliary channels 40 may be produced in a manner analogous to what was already described for the cooling channels 32 and the auxiliary channels are filled with an elastic material to simplify the handling of the upper part 28 during the optical contact bonding to the lower part 27.

There is a substantial difference to FIG. 9 in respect of the shape of the auxiliary channels 40. Instead of linearly formed auxiliary channels 40, the upper part 28 according to FIG. 10 has a plurality of auxiliary channels 40 which are in the form of annuli to fit the circular outer contour of the upper part 28 and which are arranged concentrically with respect to one another. Since the upper part 28 is once again particularly easily deformable in the region of the instances of material weakening formed by the auxiliary channels 40, the curvature of the upper part 28 and, in particular, also the curvature of the connecting surface 30 of the upper part 28 can be changed by suitable forces in this embodiment.

To match the different geometry of the lower part 27 and the upper part 28, a different procedure when optically contact bonding the upper part 28 onto the lower part 27 is also chosen in the embodiment of FIG. 10. A difference is that optical contact bonding of the upper part 28 onto the lower part 27 is started not in the vicinity of the outer contour but at the centre of the upper part 28. In the case of an upper part 28 with a convexly formed connecting surface 30, the upper part 28 is deformed in such a way to this end that the connecting surface 30 is curved to a more pronounced effect, that is to say the absolute values of their mean radii of curvature are reduced. In particular, this also leads to the connecting surface 30 of the upper part 28 being curved to more pronounced extent than the connecting surface 29 of the lower part 27, that is to say the absolute values of the mean radii of curvature of the connecting surface 30 of the upper part 28 are smaller than the absolute values of the mean radii of curvature of the lower part 27.

In this significantly curved state, the connecting surface 30 of the upper part 28 is increasingly brought close to the connecting surface 29 of the lower part 27, the upper part 28 and the lower part 27 being oriented substantially parallel to one another. However, as a consequence of the deformation of the upper part 28 there is no exact parallelism, but the distances to the connecting surface 29 of the lower part 27 are slightly smaller at the centre of the connecting surface 30 of the upper part 28 than at its edge. Consequently, there is a similar situation present in respect of the distances as illustrated in FIG. 6.

As they are brought ever closer, there finally is contact between the connecting surface of the upper part 28 and the connecting surface 29 of the lower part 27. This contact takes place at the centre of the connecting surface 30 of the upper part 28, and so a contact surface 38 is formed there and the upper part 28 is locally optically contact bonded onto the lower part 27. Uncontrolled large-area optical contact bonding is prevented by virtue of the distance between the connecting surface 30 of the upper part 28 and the connecting surface 29 of the lower part 27 likewise increasing with increasing distance from the centre on account of the different curvatures of the connecting surfaces 29, 30. Consequently, the contact surface 38 is initially limited to the centre and its immediate vicinity.

Next, the connecting surface 30 of the upper part 28 is pressed against the connecting surface 29 of the lower part 27 in regions extending successively radially outwardly from the centre and the curvature-amplifying deformation of the upper part 28 is reduced at the same time, with the result that the contact surface 38 increases in size radially outwardly and the connecting surface 30 of the upper part 28 is thereby optically contact bonded onto the connecting surface 29 of the lower part 27 in a concentrically increasing area until, ultimately, an optical contact bond over the full area has been achieved. In the process, an optical contact bond front that moves radially outwardly from the centre is formed. This is indicated by the arrows for the rolling direction 39.

Overall, the optical contact bonding operation is consequently started by bringing the connecting surface 30 of the upper part 28 and the connecting surface 29 of the lower part 27 together in the centre of the connecting surface 30 of the upper part 28 and therefore, as a rule, also in the centre of the region of the optical surface 31 and is continued by a rolling movement directed radially outwardly, until the connecting surface 30 of the upper part 28 is completely optically contact bonded onto the connecting surface 29 of the lower part 27. For the rest, what was stated with respect to FIG. 9 applies analogously, that is to say the webs adjacent to the auxiliary channels 40 are ablated before the optical surface 31 is formed, etc.

The deformation of the upper part 28 used for the optical contact bonding process as described can be slightly reduced by virtue of the upper part 28 being manufactured with a connecting surface 30 that has a slightly more pronounced curvature than the connecting surface 29 of the lower part 27. However, it is generally desirable for the difference to not be chosen to be too large, so as to render reliable optical contact bonding possible even in the vicinity of the outer contour of the upper part 28, that is to say in a region where the connecting surface 30 of the upper part 28 has a distance from the connecting surface 29 of the lower part 27 even in the non-deformed state of the upper part 28 as a result of this measure.

In the case of a concavely formed connecting surface 30 of the upper part 28 and a convexly formed connecting surface 29 of the lower part 27, the procedure is analogously carried out in reverse such that, once again, optical contact bonding is started in the centre and rolling is carried out radially to the outside.

Deviating from the illustration, the auxiliary channels 40 may also be formed as ring segments, a plurality of ring segments in each case being able to reproduce a ring shape. The rings or ring segments need not necessarily be circular and may also be formed in accordance with differently shaped curves.

The aforementioned statements each relate to embodiments in which the cooling channels 32, if present, are arranged in the upper part 28 and are formed as open towards the connecting surface 30 of the upper part 28. However, cooling channels 32 may respectively also be arranged in the lower part 27 and may be formed as open towards the connecting surface 29 of the lower part 27. However, a sufficient deformability of the upper part 28 is generally desirable to ensure in this case by cooling channels 32 and/or auxiliary channels 40 in the upper part 28.

Cooling channels 32 that extend parallel to the rolling direction 39 may be provided in all embodiments for the purposes of assisting the venting during the optical contact bonding.

In all embodiments, a bonding process may be performed after optically contact bonding the upper part 28 onto the lower part 27. A heat treatment is performed within the scope of the bonding process, the upper part 28 and the lower part 27 optionally being able to be pressed against one another. In this way, covalent bonds are formed between atoms in the region of the connecting surface 30 of the upper part 28 and of the connecting surface 29 of the lower part 27, possibly in addition to already existing covalent bonds. This results in increased durability of the connection between the upper part 28 and the lower part 27.

Following the bonding process, the upper part 28 may be worked away to a thickness above the cooling channels 32 of 1 to 10 mm.

After the working step of the thickness reduction of the upper part 28, or instead of this working step, the upper part 28 is re-worked in such a way that on its side which is facing away from the connecting surface 30, and on which the optical surface 31 is to be formed, it has a predefined form with high precision and satisfies predefined roughness criteria. Then, the optical surface 31 is formed there. This may take place for example by applying an aluminium layer or alternately applying layers of molybdenum and silicon.

REFERENCE SIGNS

1 Projection exposure apparatus
2 Illumination system

3 Radiation source
4 Illumination optical unit
5 Object field
6 Object plane
7 Reticle
8 Reticle holder
9 Reticle displacement drive
10 Projection optical unit
11 Image field
12 Image plane
13 Wafer
14 Wafer holder
15 Wafer displacement drive
16 Illumination radiation
17 Collector
18 Intermediate focal plane
19 Deflection mirror
20 First facet mirror
21 First facet
22 Second facet mirror
23 Second facet
24 Cooling device
25 Control device
26 Mirror
27 Lower part
28 Upper part
29 Connecting surface
30 Connecting surface
31 Optical surface
32 Cooling channel
33 Cooling channel opening
34 Distributor channels
35 Collector channels
36 Fluid distributor
37 Fluid collector
38 Contact surface
39 Rolling direction
40 Auxiliary channel
41 Auxiliary channel opening
M Mirror
M1 Mirror
M2 Mirror
M3 Mirror
M4 Mirror
M5 Mirror
M6 Mirror

What is claimed is:

1. A method, comprising:
providing a first mirror part comprising a first connecting surface and a second mirror part comprising a second connecting surface, the second mirror part comprising channels selected from the group consisting of cooling channels and auxiliary channels;
bringing together the first and second mirror parts so that initially a partial region of the first connecting surface and a partial region of the second connecting surface come into contact to provide a common contact surface; and
enlarging the contact surface by continuing to bring the first and second mirror parts together in a rolling movement in a transverse direction with respect to the channels, thereby forming a mirror comprising the first connecting surface optical contact bonded to the second connecting surface,
wherein the channels open toward the second connecting surface, and the channels are devoid of solid material.

2. The method of claim 1, wherein the second mirror part comprises the cooling channels.

3. The method of claim 2, wherein the second mirror part comprises the auxiliary channels.

4. The method of claim 1, wherein at least one member selected from the group consisting of the first connecting surface and the second connecting surface has a curvature.

5. The method of claim 1, wherein:
the first connecting surface is convex and the second connecting surface is concave, or the first connecting surface is concave and the second connecting surface is convex; and
while the first and second mirror parts are being brought together, an absolute value of a mean radius of curvature of the convex surface is less than an absolute value of a mean radius of curvature of the concave surface.

6. The method of claim 1, wherein, for at least one surface selected from the group consisting of the first connecting surface and the second connecting surface, the surface is not rotationally symmetrically so that it has different mean radii of curvature.

7. The method of claim 6, further comprising continuing to bring together the first and second mirror parts along a direction in which the first connecting surface and/or the second connecting surface has a radius of curvature with a smallest absolute value.

8. The method of claim 1, wherein the first mirror part comprises cooling channels that open toward the first connecting surface.

9. The method of claim 1, wherein the second mirror part comprises the auxiliary channels, and the auxiliary channels open toward a side of the second mirror part to provide an optical surface.

10. The method of claim 9, wherein the second mirror part further comprises the cooling channels.

11. The method of claim 9, wherein the auxiliary channels contain a first material, and the second mirror part comprises a second material different from the first material while the first and second mirror parts are brought together.

12. The method of claim 9, further comprising levelling out the auxiliary channels before the optical surface is formed.

13. The method of claim 1, wherein the channels have a linear profile.

14. The method of claim 1, wherein the channels are ring-shaped or comprises ring segments.

15. The method of claim 1, further comprising disposing the mirror in an illumination optical unit.

16. The method of claim 1, further comprising disposing the mirror in a projection lens.

17. The method of claim 1, further comprising disposing the mirror in a microlithographic projection exposure apparatus.

18. A method, comprising:
providing a first mirror part comprising a first connecting surface and a second mirror part comprising a second connecting surface, the second mirror part comprising at least one member selected from the group consisting of cooling channels and auxiliary channels;
bringing together the first and second mirror parts so that initially a partial region of the first connecting surface and a partial region of the second connecting surface come into contact to provide a common contact surface; and
enlarging the contact surface by continuing to bring the first and second mirror parts together in a transverse direction with respect to the at least one member, wherein:

the first connecting surface is convex and the second connecting surface is concave, or the first connecting surface is concave and the second connecting surface is convex; and while the first and second mirror parts are being brought together, an absolute value of a mean radius of curvature of the convex surface is less than an absolute value of a mean radius of curvature of the concave surface.

19. A method, comprising:

providing a first mirror part comprising a first connecting surface and a second mirror part comprising a second connecting surface, the second mirror part comprising at least one member selected from the group consisting of cooling channels and auxiliary channels;

bringing together the first and second mirror parts so that initially a partial region of the first connecting surface and a partial region of the second connecting surface come into contact to provide a common contact surface; and enlarging the contact surface by continuing to bring the first and second mirror parts together in a transverse direction with respect to the at least one member, wherein:

for at least one surface selected from the group consisting of the first connecting surface and the second connecting surface, the surface is not rotationally symmetrically so that it has different mean radii of curvature; and the method further comprises continuing to bring together the first and second mirror parts along a direction in which the first connecting surface and/or the second connecting surface has a radius of curvature with a smallest absolute value.

* * * * *